US012745815B2

(12) United States Patent
Budnik et al.

(10) Patent No.: US 12,745,815 B2
(45) Date of Patent: Sep. 29, 2026

(54) VOLTAGE DETECTION DEVICES AND SYSTEMS

(71) Applicant: Milwaukee Electric Tool Corporation, Brookfield, WI (US)

(72) Inventors: Ruslan Budnik, Milwaukee, WI (US); Jesse J. Brown, Milwaukee, WI (US); Todd Andrew Zeilinger, Wauwatosa, WI (US); Samuel L. Lombardi, Milwaukee, WI (US); Thomas S. Whitburn, Milwaukee, WI (US); Scott Michael Cline, Menomonee Falls, WI (US); Claire A. Sigworth, Milwaukee, WI (US); Bryce M. Lee, Glendale, WI (US); Brandon L. Feil, Brookfield, WI (US)

(73) Assignee: Milwaukee Electric Tool Corporation, Brookfield, WI (US)

(*) Notice: Subject to any disclaimer, the term of this patent is extended or adjusted under 35 U.S.C. 154(b) by 358 days.

(21) Appl. No.: 18/471,924

(22) Filed: Sep. 21, 2023

(65) Prior Publication Data

US 2024/0081457 A1 Mar. 14, 2024

Related U.S. Application Data

(63) Continuation of application No. PCT/US2023/032419, filed on Sep. 11, 2023.

(Continued)

(51) Int. Cl.

*G01R 19/155* (2006.01)
*A42B 3/04* (2006.01)

(52) U.S. Cl.

CPC ............ *A42B 3/046* (2013.01); *A42B 3/0453* (2013.01); *G01R 19/155* (2013.01)

(58) Field of Classification Search

CPC ..... A42B 3/046; A42B 3/0406; A42B 3/0413; A42B 3/042; A42B 3/0426; A42B 3/0433;

(Continued)

(56) References Cited

U.S. PATENT DOCUMENTS 3,273,163 A * 9/1966 Andrews, III ........... A42B 3/04 2/422
3,309,690 A 3/1967 Moffitt (Continued)

FOREIGN PATENT DOCUMENTS

CN 86102149 3/1988
CN 87209558 6/1988

(Continued)

OTHER PUBLICATIONS

International Search Report and Written Opinion for International Application No. PCT/US2023/032419, dated Dec. 26, 2023, 9 pages.

(Continued)

*Primary Examiner* — Herbert K Roberts
(74) *Attorney, Agent, or Firm* — Reinhart Boerner Van Deuren s.c.

(57) ABSTRACT

Various embodiments of a voltage detection device and of related safety systems are provided. In various embodiments, the voltage detection device is configured to couple to safety headwear, such as via the one or more housing(s) of the voltage detection device coupling directly to the safety headwear or the voltage detection device coupling to an adaptor mounted to the hard hat.

9 Claims, 36 Drawing Sheets

Related U.S. Application Data

(60) Provisional application No. 63/387,571, filed on Dec. 15, 2022, provisional application No. 63/381,829, filed on Nov. 1, 2022, provisional application No. 63/380,311, filed on Oct. 20, 2022, provisional application No. 63/405,673, filed on Sep. 12, 2022.

(58) Field of Classification Search
CPC ..... A42B 3/044; A42B 3/0446; A42B 3/0453; A42B 3/0466; A42B 3/048
See application file for complete search history.

(56) References Cited

U.S. PATENT DOCUMENTS

| | | | | |
|---|---|---|---|---|
| 3,774,110 | A | 11/1973 | Roveti | |
| 3,786,468 | A | 1/1974 | Moffitt | |
| 4,276,657 | A * | 7/1981 | Montesi | A42B 3/185 2/10 |
| 6,329,924 | B1 | 12/2001 | McNulty | |
| 6,616,294 | B1 * | 9/2003 | Henry | F21V 21/084 2/6.2 |
| 6,897,783 | B2 | 5/2005 | Zeng et al. | |
| 7,733,078 | B2 | 6/2010 | Duke | |
| D622,956 | S | 9/2010 | Hoffman | |
| 8,710,979 | B2 | 4/2014 | Frederick | |
| 8,754,629 | B2 | 6/2014 | Govier et al. | |
| 8,786,447 | B1 | 7/2014 | Wise | |
| 9,146,262 | B2 | 9/2015 | Lamoreux et al. | |
| 9,265,331 | B1 | 2/2016 | Hoffman | |
| 9,494,623 | B2 | 11/2016 | McNulty | |
| 9,494,632 | B1 | 11/2016 | McNulty | |
| 9,874,342 | B1 | 1/2018 | Liu et al. | |
| 10,004,289 | B2 * | 6/2018 | Teetzel | A42B 3/04 |
| 10,006,953 | B2 | 6/2018 | Rachakonda et al. | |
| 10,055,971 | B2 | 8/2018 | M R et al. | |
| 10,244,808 | B2 | 4/2019 | da Silva et al. | |
| 10,269,232 | B2 | 4/2019 | Rachakonda et al. | |
| 10,544,899 | B2 | 1/2020 | Hakins et al. | |
| 10,802,065 | B2 | 10/2020 | McNulty et al. | |
| 11,009,532 | B2 | 5/2021 | Thompson et al. | |
| 11,579,174 | B2 | 2/2023 | Thompson et al. | |
| 11,982,403 | B2 | 5/2024 | Hakins et al. | |
| 2005/0264427 | A1 | 12/2005 | Zeng et al. | |
| 2017/0205454 | A1 * | 7/2017 | Rachakonda | G01R 29/0857 |
| 2017/0358194 | A1 | 12/2017 | Glatfelter et al. | |
| 2018/0122218 | A1 | 5/2018 | Shanley | |
| 2018/0299496 | A1 * | 10/2018 | McNulty | G01R 1/04 |
| 2018/0315289 | A1 * | 11/2018 | McNulty | G08B 21/182 |
| 2020/0154811 | A1 | 5/2020 | Hyma | |
| 2021/0106089 | A1 * | 4/2021 | Hyma | A42B 3/0446 |
| 2021/0145104 | A1 | 5/2021 | Jones et al. | |
| 2022/0175072 | A1 | 6/2022 | Jones et al. | |
| 2022/0183889 | A1 | 6/2022 | Becker et al. | |
| 2022/0276288 | A1 * | 9/2022 | Thompson | G01R 19/155 |
| 2022/0408869 | A1 * | 12/2022 | Franzino | A42B 3/04 |
| 2023/0172301 | A1 | 6/2023 | Kenward et al. | |
| 2023/0341443 | A1 | 10/2023 | Thompson et al. | |
| 2023/0353974 | A1 | 11/2023 | Thompson et al. | |
| 2023/0353975 | A1 | 11/2023 | Thompson et al. | |
| 2023/0366919 | A1 | 11/2023 | Maus et al. | |
| 2024/0081457 | A1 | 3/2024 | Budnik et al. | |

FOREIGN PATENT DOCUMENTS

| | | |
|---|---|---|
| CN | 2128387 | 3/1993 |
| CN | 2149632 | 12/1993 |
| CN | 2169858 | 6/1994 |
| CN | 1027525 | 2/1995 |
| CN | 2329009 | 7/1999 |
| CN | 2498864 | 7/2002 |
| CN | 2504919 | 8/2002 |
| CN | 200953858 | 10/2007 |
| CN | 201097668 | 8/2008 |
| CN | 201204972 | 3/2009 |
| CN | 201328403 | 10/2009 |
| CN | 201413561 | 2/2010 |
| CN | 201426420 | 3/2010 |
| CN | 201504614 | 6/2010 |
| CN | 101766355 | 7/2010 |
| CN | 201523706 | 7/2010 |
| CN | 201700461 | 1/2011 |
| CN | 201718546 | 1/2011 |
| CN | 201743007 | 2/2011 |
| CN | 201886593 | 6/2011 |
| CN | 201976827 | 9/2011 |
| CN | 102232645 | 11/2011 |
| CN | 102283458 | 12/2011 |
| CN | 102450764 | 5/2012 |
| CN | 202211209 | 5/2012 |
| CN | 102664360 | 9/2012 |
| CN | 202471820 | 10/2012 |
| CN | 202548220 | 11/2012 |
| CN | 202635716 | 1/2013 |
| CN | 202664366 | 1/2013 |
| CN | 202819759 | 3/2013 |
| CN | 103054255 | 4/2013 |
| CN | 103141984 | 6/2013 |
| CN | 202958973 | 6/2013 |
| CN | 203182109 | 9/2013 |
| CN | 203217718 | 9/2013 |
| CN | 203219981 | 10/2013 |
| CN | 203302413 | 11/2013 |
| CN | 103462293 | 12/2013 |
| CN | 203446680 | 2/2014 |
| CN | 203590958 | 5/2014 |
| CN | 103829438 | 6/2014 |
| CN | 203643516 | 6/2014 |
| CN | 203646574 | 6/2014 |
| CN | 203786215 | 8/2014 |
| CN | 104062488 | 9/2014 |
| CN | 203838852 | 9/2014 |
| CN | 203851872 | 10/2014 |
| CN | 203897391 | 10/2014 |
| CN | 204132513 | 2/2015 |
| CN | 204157745 | 2/2015 |
| CN | 204207156 | 3/2015 |
| CN | 204245253 | 4/2015 |
| CN | 204245263 | 4/2015 |
| CN | 204302690 | 4/2015 |
| CN | 104730352 | 6/2015 |
| CN | 104856334 | 8/2015 |
| CN | 204599445 | 9/2015 |
| CN | 204599446 | 9/2015 |
| CN | 204631112 | 9/2015 |
| CN | 103514709 | 3/2016 |
| CN | 105595498 | 5/2016 |
| CN | 105639817 | 6/2016 |
| CN | 105661727 | 6/2016 |
| CN | 105809891 | 7/2016 |
| CN | 205409836 | 8/2016 |
| CN | 205512584 | 8/2016 |
| CN | 105957302 | 9/2016 |
| CN | 205547512 | 9/2016 |
| CN | 205567953 | 9/2016 |
| CN | 106037111 | 10/2016 |
| CN | 106037114 | 10/2016 |
| CN | 205621227 | 10/2016 |
| CN | 205624666 | 10/2016 |
| CN | 205624669 | 10/2016 |
| CN | 205624678 | 10/2016 |
| CN | 205624679 | 10/2016 |
| CN | 205665834 | 10/2016 |
| CN | 205788655 | 12/2016 |
| CN | 205827619 | 12/2016 |
| CN | 205831180 | 12/2016 |
| CN | 104305628 | 1/2017 |
| CN | 106418865 | 2/2017 |
| CN | 205993699 | 3/2017 |
| CN | 206025325 | 3/2017 |
| CN | 106600892 | 4/2017 |
| CN | 106690630 | 5/2017 |
| CN | 106723582 | 5/2017 |
| CN | 206165932 | 5/2017 |

(56) References Cited

FOREIGN PATENT DOCUMENTS

| | | |
|---|---|---|
| CN | 206197169 | 5/2017 |
| CN | 206238559 | 6/2017 |
| CN | 206275225 | 6/2017 |
| CN | 206284469 | 6/2017 |
| CN | 106954908 | 7/2017 |
| CN | 206294953 | 7/2017 |
| CN | 206363493 | 7/2017 |
| CN | 206390369 | 8/2017 |
| CN | 304317745 | 10/2017 |
| CN | 107319671 | 11/2017 |
| CN | 107518487 | 12/2017 |
| CN | 206699508 | 12/2017 |
| CN | 207070902 | 3/2018 |
| CN | 207097202 | 3/2018 |
| CN | 207100658 | 3/2018 |
| CN | 207100662 | 3/2018 |
| CN | 207136351 | 3/2018 |
| CN | 207164132 | 3/2018 |
| CN | 107927978 | 4/2018 |
| CN | 107927982 | 4/2018 |
| CN | 207202181 | 4/2018 |
| CN | 207269940 | 4/2018 |
| CN | 108053608 | 5/2018 |
| CN | 207380127 | 5/2018 |
| CN | 108402572 | 8/2018 |
| CN | 207764948 | 8/2018 |
| CN | 207885757 | 9/2018 |
| CN | 108685246 | 10/2018 |
| CN | 108813783 | 11/2018 |
| CN | 108877145 | 11/2018 |
| CN | 208129550 | 11/2018 |
| CN | 108968204 | 12/2018 |
| CN | 208228430 | 12/2018 |
| CN | 208259134 | 12/2018 |
| CN | 109363285 | 2/2019 |
| CN | 208446724 | 2/2019 |
| CN | 109430984 | 3/2019 |
| CN | 208607772 | 3/2019 |
| CN | 109567303 | 4/2019 |
| CN | 208821797 | 5/2019 |
| CN | 209248728 | 8/2019 |
| CN | 209268809 | 8/2019 |
| CN | 209403658 | 9/2019 |
| CN | 110313672 | 10/2019 |
| CN | 209473670 | 10/2019 |
| CN | 209527961 | 10/2019 |
| CN | 110403285 | 11/2019 |
| CN | 209628678 | 11/2019 |
| CN | 209694150 | 11/2019 |
| CN | 110522113 | 12/2019 |
| CN | 110555971 | 12/2019 |
| CN | 110771982 | 2/2020 |
| CN | 210094781 | 2/2020 |
| CN | 210539109 | 5/2020 |
| CN | 210581180 | 5/2020 |
| CN | 210642690 | 6/2020 |
| CN | 210726799 | 6/2020 |
| CN | 210742379 | 6/2020 |
| CN | 210747623 | 6/2020 |
| CN | 210783078 | 6/2020 |
| CN | 111358110 | 7/2020 |
| CN | 211148772 | 7/2020 |
| CN | 111513416 | 8/2020 |
| CN | 211154009 | 8/2020 |
| CN | 211268810 | 8/2020 |
| CN | 111685436 | 9/2020 |
| CN | 211407766 | 9/2020 |
| CN | 211722027 | 10/2020 |
| CN | 211741388 | 10/2020 |
| CN | 111869981 | 11/2020 |
| CN | 211979824 | 11/2020 |
| CN | 211984041 | 11/2020 |
| CN | 212137105 | 12/2020 |
| CN | 212185372 | 12/2020 |
| CN | 112293843 | 2/2021 |
| CN | 212520950 | 2/2021 |
| CN | 112471680 | 3/2021 |
| CN | 212754459 | 3/2021 |
| CN | 112602998 | 4/2021 |
| CN | 212877811 | 4/2021 |
| CN | 212938202 | 4/2021 |
| CN | 212994749 | 4/2021 |
| CN | 109380796 | 5/2021 |
| CN | 112971252 | 6/2021 |
| CN | 213549994 | 6/2021 |
| CN | 113197383 | 8/2021 |
| CN | 113367429 | 9/2021 |
| CN | 214547602 | 11/2021 |
| CN | 110169618 | 12/2021 |
| CN | 113796614 | 12/2021 |
| CN | 113826980 | 12/2021 |
| CN | 215189619 | 12/2021 |
| CN | 215189710 | 12/2021 |
| CN | 215583259 | 1/2022 |
| CN | 215775817 | 2/2022 |
| CN | 215775820 | 2/2022 |
| CN | 114267154 | 4/2022 |
| CN | 216674864 | 6/2022 |
| CN | 113080561 | 8/2022 |
| CN | 114869004 | 8/2022 |
| CN | 217471340 | 9/2022 |
| CN | 115226985 | 10/2022 |
| CN | 115251513 | 11/2022 |
| CN | 217906480 | 11/2022 |
| CN | 115420962 | 12/2022 |
| CN | 218043940 | 12/2022 |
| CN | 218073696 | 12/2022 |
| CN | 218105023 | 12/2022 |
| CN | 218298367 | 1/2023 |
| CN | 218483850 | 2/2023 |
| CN | 115880875 | 3/2023 |
| CN | 307982393 | 4/2023 |
| CN | 112471667 | 5/2023 |
| CN | 116469220 | 7/2023 |
| CN | 219460431 | 8/2023 |
| CN | 219741959 | 9/2023 |
| CN | 219939816 | 11/2023 |
| CN | 114504158 | 2/2024 |
| CN | 117582046 | 2/2024 |
| CN | 117593847 | 2/2024 |
| CN | 117612331 | 2/2024 |
| CN | 111965652 | 3/2024 |
| CN | 110179199 | 4/2024 |
| CN | 117831219 | 4/2024 |
| CN | 220752837 | 4/2024 |
| CN | 109875171 | 5/2024 |
| DE | 1942604 | 7/1966 |
| DE | 1269241 | 5/1968 |
| DE | 2418622 | 10/1975 |
| DE | 202023105654 | 12/2023 |
| EP | 1296150 | 3/2003 |
| EP | 3144686 | 3/2017 |
| EP | 3124983 | 12/2019 |
| EP | 2746784 | 12/2020 |
| JP | 11-012842 | 1/1999 |
| JP | 2008-150761 | 7/2008 |
| JP | 2016-192036 | 11/2016 |
| WO | WO13082015 | 6/2013 |
| WO | WO18035855 | 3/2018 |
| WO | WO19063925 | 4/2019 |
| WO | WO21119751 | 6/2021 |
| WO | WO21136678 | 7/2021 |
| WO | WO2022/039990 | 2/2022 |
| WO | WO23205098 | 10/2023 |

OTHER PUBLICATIONS

Safeguard, “Compass Pro,” https://www.safeguardequipment.com/ipmag/compass-pro/, 1 page, appears to be available at least as early as Sep. 22, 2023, per Wayback Machine at: https://web.archive.org/web/20230922193502/https://www.safeguardequipment.com/ipmag/compass-pro/.

(56) References Cited

OTHER PUBLICATIONS

Safeguard, “Compass,” https://www.safequardequipment.com/ipmag/compass/, 1 page, appears to be available at least as early as 2016 per the Compass web page.
Greenlee, “Next Generation V-WATCH Personal Voltage Detector,” https://www.greenlee.com/us/en/next-generation-vwatch-personal-voltage-detector-783310081364, 3 pages, appears to be available at least as early as Jul. 2, 2022, per Wayback Machine at: https://web.archive.org/web/20220702225142/https://www.greenlee.com/us/en/next-generation-vwatch-personal-voltage-detector-783310081364.
Illumagear, “Sixth Sense by Illumagear: Personal Voltage and Current Detector,” https://illumagear.com/sixth-sense/, 1 page, appears to be available at least as early as Apr. 26, 2022 per Wayback Machine at: https://web.archive.org/web/20220426172101/https://illumagear.com/sixth-sense/.

* cited by examiner

VOLTAGE DETECTION DEVICES AND SYSTEMS

CROSS-REFERENCE TO RELATED PATENT APPLICATIONS

The present application is a continuation of International Application No. PCT/US2023/032419, filed on Sep. 11, 2023, which claims the benefit of and priority to U.S. Provisional Application No. 63/387,571 filed on Dec. 15, 2022, U.S. Provisional Application No. 63/381,829, filed on Nov. 1, 2022, U.S. Provisional Application No. 63/380,311, filed on Oct. 20, 2022, U.S. Provisional Application No. 63/405,673, filed on Sep. 12, 2022, each of which is incorporated herein by reference in its entirety.

BACKGROUND OF THE INVENTION

The present disclosure is directed generally to the field of tools and worksite safety. The present disclosure relates specifically to voltage detection devices and related safety systems for a worksite.

SUMMARY OF THE INVENTION

Various embodiments of the invention relate to a voltage detection device and/or related systems including a variety of features designed to improve worker safety in a variety of setting in which a worker may be exposed to high voltages and/or other potentially hazardous conditions.

One embodiment of the invention relates to a safety system including a first device and a second device. The first device includes a first housing including an opposing pair of protrusions extending towards each other, a first detector coupled to the first housing, and a first controller coupled to the first housing and in electrical communications with the first detector. The protrusions are configured to couple the first housing to a body of a safety headwear. The first detector is configured to generate a first signal in response to detecting nearby objects having currents with a high voltage. The first controller is configured to emit a second signal in response to receiving the first signal from the first detector. The second device includes a second housing configured to couple to a brim of the safety headwear, a second controller coupled to the second housing and in electrical communications with the first controller, and a notification device physically coupled to the second housing and in electrical communications with the second controller. The second controller is configured to generate a third signal in response to receiving the second signal from the first controller. The notification device is configured to generate an alarm in response to the notification device receiving the third signal from the second controller.

Another embodiment of the invention relates to a safety system including a hard hat including a shell formed from a rigid material, a first channel defined by the hard hat, and a first adaptor received in the first channel. The first adaptor includes an arm extending along a primary longitudinal axis between a first end and an opposing second end, a platform coupled to the first end of the arm, a first ledge extending from a first side of the arm, a second ledge extending from the first side of the arm, and a third ledge extending from a second side of the arm opposite the first side. The platform is configured to couple to an accessory for the hard hat. The first ledge includes a first coupling surface facing upward, the second ledge includes a second coupling surface facing upward and away from the first ledge, and the first ledge and second ledge are closer to the second end of the arm than the third ledge. At least one of the first coupling surface and the second coupling surface interfaces with the hard hat. The third ledge includes a lower surface facing downward that interfaces against the hard hat.

Another embodiment of the invention relates to a safety system including a hard hat including a shell formed from a rigid material, an adaptor, and a first device coupled to the platform. The adaptor includes a housing, an opposing pair of protrusions extending from the housing towards each other, and a platform coupled to the housing. The protrusions couple the adaptor to the shell. The first device includes a first housing coupled to the platform, a first controller coupled to the first housing, and a first detector coupled to the first housing and in electrical communications with the first controller. The first detector is configured to generate a first signal in response to detecting nearby objects having currents with a high voltage.

Another embodiment of the invention relates to a safety system including a first device and a second device. The first device includes a first housing including an opposing pair of tongues extending towards each other, the tongues configured to couple the first housing to a front of a safety headwear, a first electronics within the first housing, a first detector coupled to the first housing and electrically coupled to the first electronics, the first detector configured to detect nearby objects having currents with a high voltage, and a plurality of interface buttons electrically coupled to the first electronics and configured to control the first detector. The second device includes a second housing configured to couple to a brim of the safety headwear, a second electronics within the second housing, the second electronics being in communication with the first electronics, and one or more notification devices physically coupled to the second housing and electrically coupled to the second electronics, the one or more notification devices configured to generate an alarm in response to the second electronics receiving a warning signal from the first electronics.

Another embodiment of the invention relates to a safety device including a first housing including an opposing pair of tongues extending towards each other, the tongues configured to couple the first housing to a front of a safety headwear, a first electronics within the first housing, a first detector coupled to first housing and electrically coupled to the first electronics, the first detector configured to detect nearby objects having currents with a high voltage, a plurality of interface buttons electrically coupled to the first electronics and configured to control the first detector, and one or more notification devices physically coupled to the first housing and electrically coupled to the first electronics. The one or more notification devices are configured to generate an alarm in response to the first electronics receiving a warning signal from the first detector.

Another embodiment of the invention relates to a safety device including a first housing, a first detector coupled to first housing and electrically coupled to the first electronics, the first detector configured to detect nearby objects having currents with a high voltage, a plurality of interface buttons electrically coupled to the first electronics and configured to control the first detector, and one or more notification devices physically coupled to the first housing and electrically coupled to the first electronics. The one or more notification devices are configured to generate an alarm in response to the first electronics receiving a warning signal from the first detector.

Additional features and advantages will be set forth in the detailed description which follows, and, in part, will be readily apparent to those skilled in the art from the description or recognized by practicing the embodiments as described in the written description included, as well as the appended drawings. It is to be understood that both the foregoing general description and the following detailed description are exemplary.

The accompanying drawings are included to provide further understanding and are incorporated in and constitute a part of this specification. The drawings illustrate one or more embodiments and, together with the description, serve to explain principles and operation of the various embodiments. In addition, alternative exemplary embodiments relate to other features and combinations of features as may be generally recited in the claims.

BRIEF DESCRIPTION OF THE DRAWINGS

This application will become more fully understood from the following detailed description, taken in conjunction with the accompanying figures, wherein like reference numerals refer to like elements in which.

DETAILED DESCRIPTION

Figure 1:
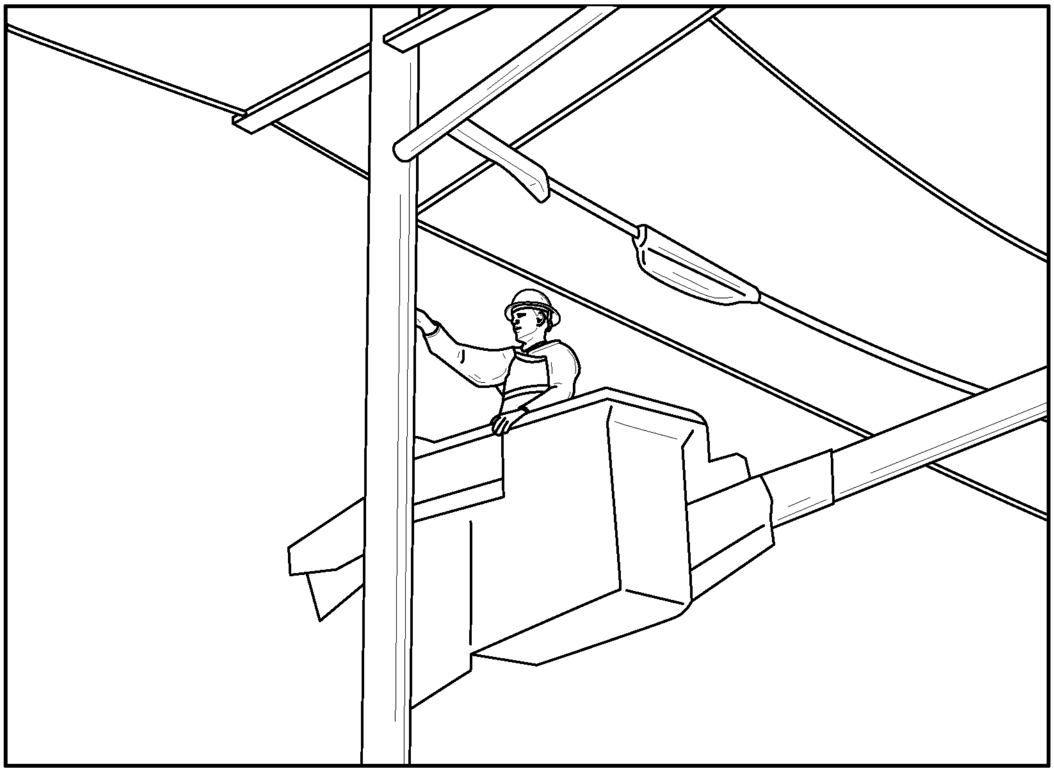
FIG. 1 depicts a safety system, according to an exemplary embodiment.
Figure 2:
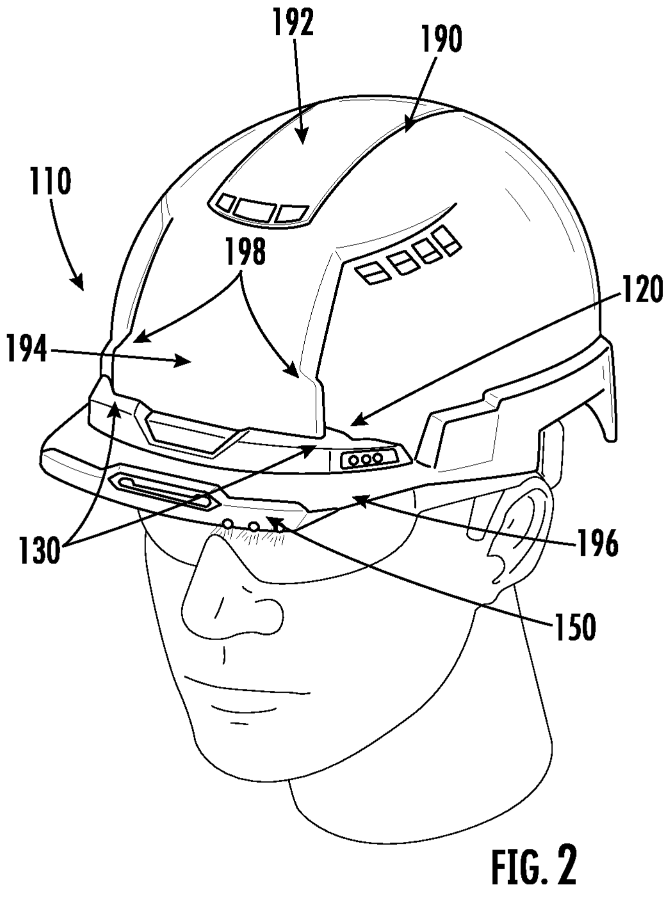
FIG. 2 depicts the safety system of FIG. 1, according to an exemplary embodiment.
Figure 3:
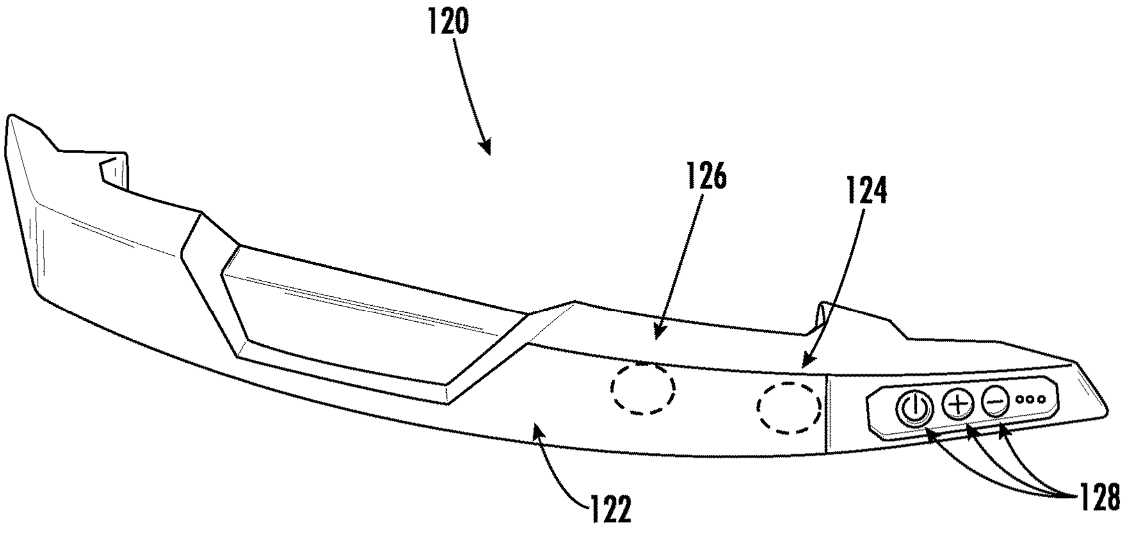
FIG. 3 depicts a first device of the safety system of FIG. 1, according to an exemplary embodiment.
Figure 4:
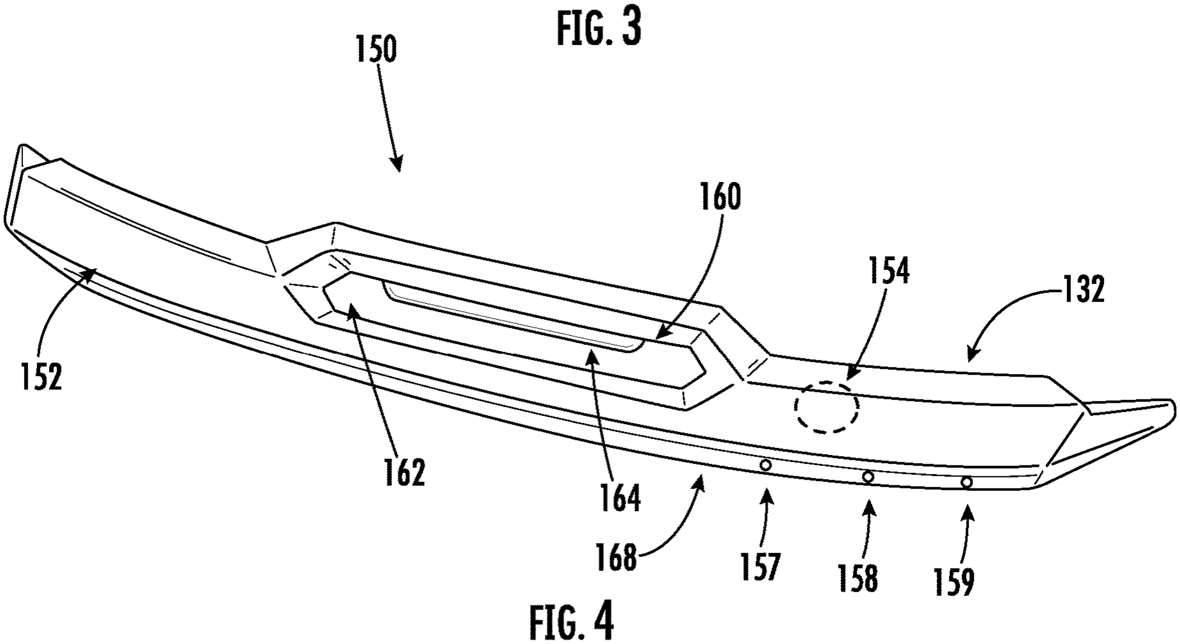
FIG. 4 depicts a second device of the safety system of FIG. 1, according to an exemplary embodiment.

Referring generally to the figures, various embodiments of voltage detection devices and related safety systems are provided. One or more of the systems and devices described herein are directed at improving safety in working environments, such as by detecting objects conducting high voltage and/or other hazards. Various embodiments described herein integrate with other objects being worn by workers to provide warnings and/or signals indicating when the worker is near an object conducting a high voltage current.

Applicant has developed voltage detection device that couple to safety headwear, such as either directly coupling to the safety headwear or coupling to an adaptor configured to couple to the safety headwear. In an exemplary embodiment, the voltage detection device includes a first device coupled to the shell of the safety headwear, and a second device coupled to the brim. The first device includes a detector to detect a dangerous condition and the second device includes one or more notification devices. In another exemplary embodiment, the voltage detection device is coupled to an adaptor coupled to a channel defined by the safety headwear. In another exemplary embodiment, the voltage detection device is coupled to an adaptor coupled to the front of the safety headwear.

Referring to FIGS. 1-5, various aspects of safety system 110 are shown. Safety system 110 includes first device 120 and second device 150. In various embodiments, first device 120 and second device 150 are distinct from each other, such as via not directly interfacing with each other and being coupled to safety headwear 190 at different locations.

In use, safety system 110 is detachably and reversibly mechanically coupled to safety headwear 190, such as a hard hat. Safety headwear 190 includes a body 192, such as a shell formed from a rigid material, surrounding the upper portion of the head of the wearer, a front 194 of body 192, a brim 196 extending forward from body 192, and ribs 198. In various embodiments, ribs 198 extend away from each other and extend circumferentially around a portion of front 194 of body 192.

First device 120 couples to front 194 of safety headwear 190, such as to ribs 198. For example, first device 120 includes housing 122 including an opposing pair of protrusions 130 extending towards each other, the protrusions 130 configured to couple the first housing 122 to a front 194 of a body 192 of a safety headwear 190, such as to ribs 198. In various embodiments, housing 122 defines back surface 132 facing away from the second device 150, and the pair of protrusions 130 extend over the back surface 132. In various embodiments, first device 120 includes a first housing 122, a controller 124 (e.g., internal wiring and/or circuitry), a detector 126, and/or one or more interface buttons 128 electrically coupled to the controller 124 and configured to control the detector 126 and/or controller 124. Detector 126 is configured to detect whether an object, such as a nearby object, has a current with high voltage. In various embodiments, detector 126 is configured to generate a signal (e.g., signal 170) that is communicated to controller 124. In various embodiments, controller 124 is coupled to the housing 122 and is in electrical communications with the detector 126, and the controller 124 is configured to emit a second signal (e.g., signal 172) in response to receiving a signal (e.g., signal 170) from the detector 126. In various embodiments, first device 120 transmits and receives signals, such as wireless signals, via communication system 121, and second device 150 transmits and receives signals, such as wireless signals, via communication system 153. In various embodiments, one or both of communication system 121 and communication system 153 include an antenna to facilitate wireless communications.

Second device 150 includes housing 152 configured to couple to a brim of safety headwear (e.g., brim 196 of safety headwear 190), controller 154 coupled to housing 152 and in electrical communication with controller 124 (e.g., controller 124 and controller 154 wirelessly communicate with each other), and one or more notification devices 157, 158, 159 physically coupled to the housing 152 and in electrical communications with controller 154. In various embodiments, controller 154 is configured to generate a signal (e.g., signal 174) in response to receiving a signal from controller 124 (e.g., signal 172). In various embodiments, one or more of notification devices 157, 158, 159 are configured to generate an alarm in response to the respective notification device(s) 157, 158, 159 receiving a signal from controller 154 (e.g., signal 174). In various embodiments, the alarm includes a first alarm selected from the group consisting of a visual alarm (e.g., a flashing light) and an audio alarm (e.g., a buzzing signal, a chirp). In various embodiments, the alarm includes a haptic signal (e.g., the notification device 159 vibrating). In various embodiments, notification device 157 is configured to emit a visual alarm, notification device 158 is configured to emit an audio alarm, and notification device 159 is configured to emit a haptic alarm. In various embodiments, housing 152 defines lower surface 168, and one or more of notification devices 157, 158, 159 are coupled to lower surface 168. For example, in various embodiments notification device 157 that emits a visual alarm is coupled to lower surface 168 to facilitate the user seeing the visual alarm in response to notification device 157 receiving signal 174 from controller 154.

Coupling mechanism 160 of second device 150 couples second device 150 to safety headwear 190, such as to brim 196 of safety headwear 190. In various embodiments, coupling mechanism 160 includes aperture 162 and protrusion 164 that extends into aperture 162. In various embodiments, a portion of brim 196 extends within aperture 162, and protrusion 164 interfaces with brim 196 to bias second device 150 to remain coupled to brim 196. In various embodiments, aperture 162 and protrusion 164 are configured to collectively couple the second device 150 to the brim 196 of the safety headwear 190.

In various embodiments, second device 150 includes a second housing 152, a second controller 154 (e.g., internal wiring and/or circuitry), and/or one or more notification devices 157, 158, 159 physically coupled to the second housing 152 and electrically coupled to the second controller 154. In response to receiving a signal that detector 126 detected a hazardous condition (e.g., high voltage), notification devices 157, 158, 159 are configured to provide one or more of an audio alarm (.g., an alarm sound), a visual alarm (e.g., a light and/or a flashing light, such as via a brim-mounted LED), and/or a haptic signal (e.g., a vibration).

In use, first controller 124 of first device 120 are in communication with second controller 154 of second device 150, such as wireless communications. When detector 126 detects a hazardous condition, first controller 124 sends a signal to second controller 154 to generate an alert.

Figure 5:
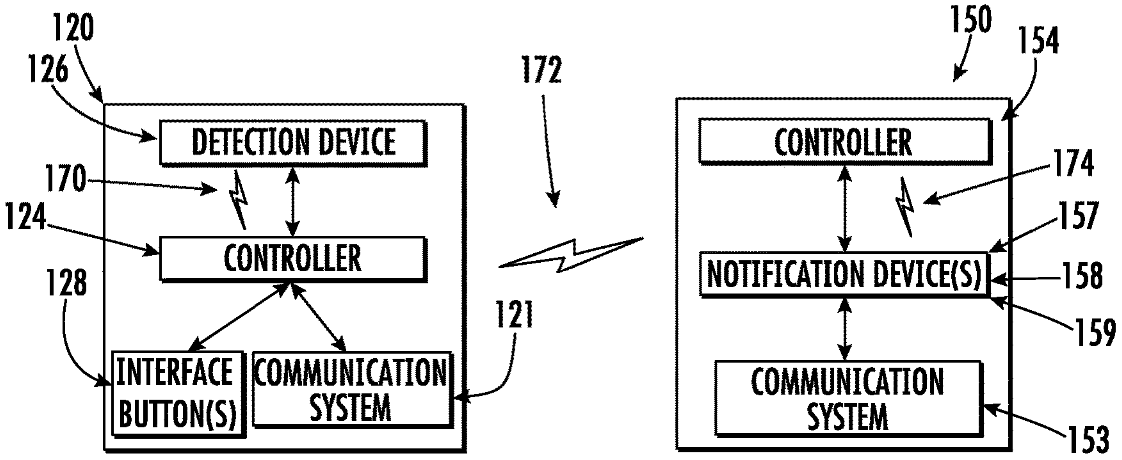
FIG. 5 depicts a block diagram of the first device and the second device of the safety system of FIG. 1, according to an exemplary embodiment.

Referring to FIG. 5, a block diagram of first device 120 and second device 150 is provided. In use, detection device 126 generates signal 170 in response to detecting nearby objects having currents with a high voltage (e.g., one or more electrical currents with a high voltage). Controller 124 of device 120 generates signal 172 in response to receiving first signal 170. Controller 154 of device 150 generates signal 174 in response to receiving signal 172. One or more of notification device(s) 157, 158, and 159 generate an alarm in response to receiving signal 174.

Figure 6:
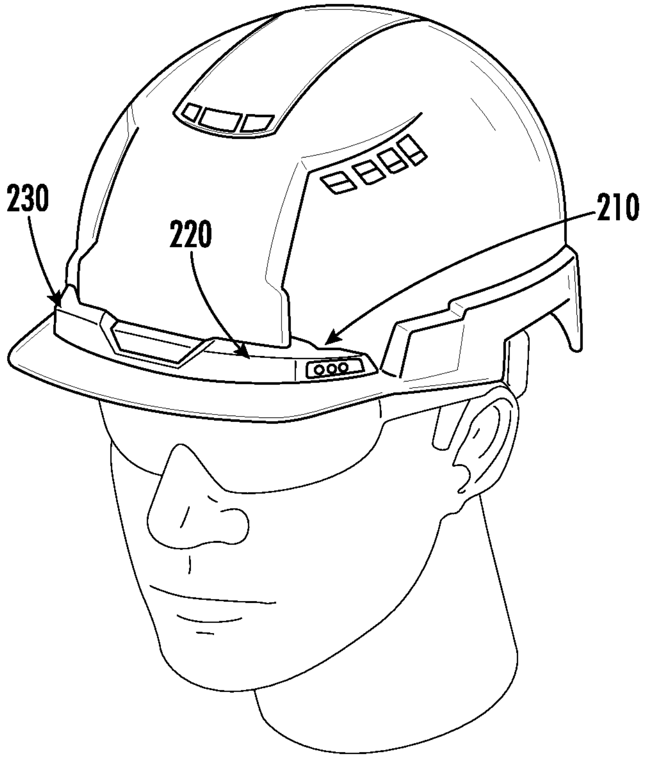
FIG. 6 depicts a detection device, according to another exemplary embodiment.

Referring to FIG. 6, safety device 210 is shown according to an exemplary embodiment. Safety device 210 is substantially the same as safety system 110 except for the differences discussed herein.

Briefly, safety device 210 includes the components and functionality of first device 120 and/or second device 150. In particular, safety device 210 includes one or more notification devices 230 coupled to housing 220. Notification devices 230 are the same and/or similar to notification devices 157, 158, 159 on second device 150.

Figure 7:
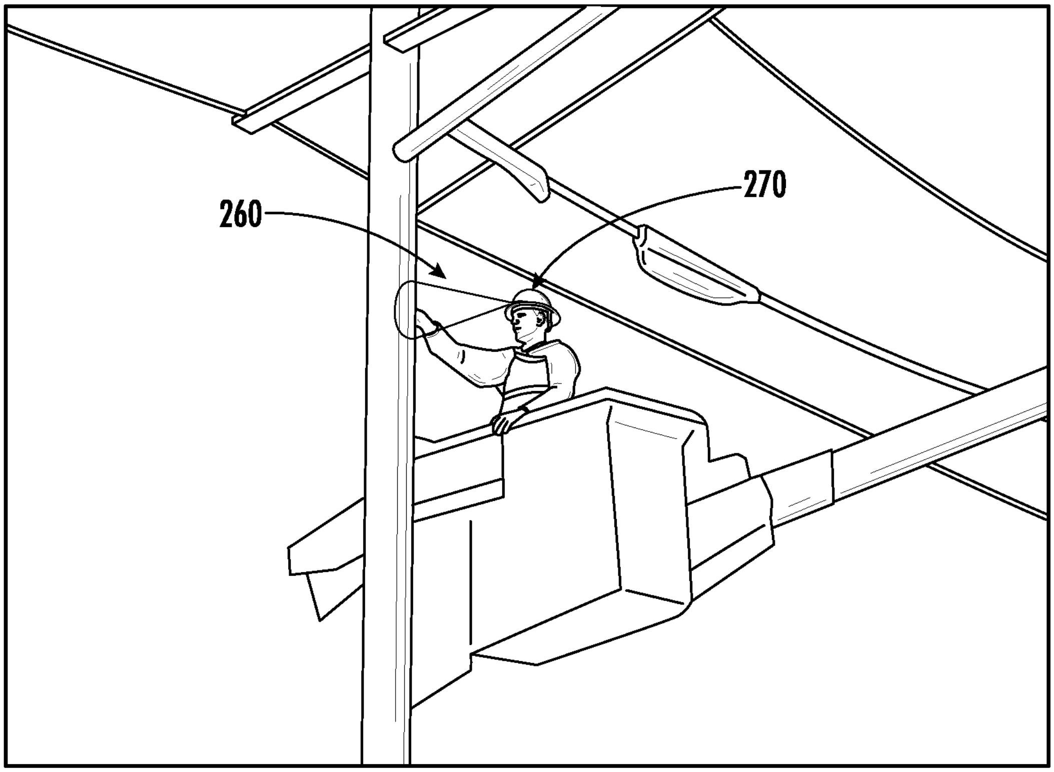
FIG. 7 depicts a safety system, according to another exemplary embodiment.
Figure 8:
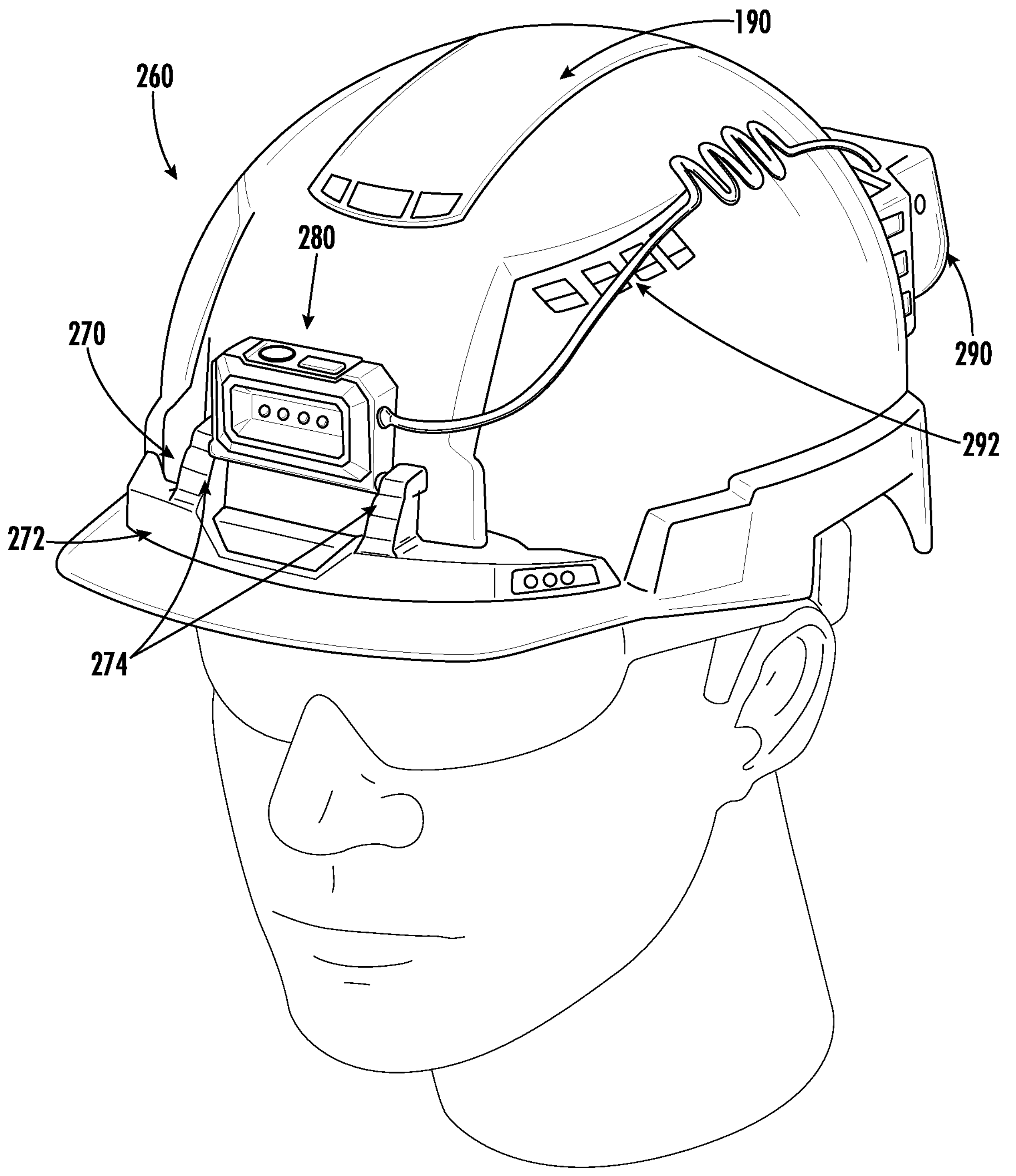
FIG. 8 depicts the safety system of FIG. 7, according to an exemplary embodiment.

Referring to FIGS. 7-8, safety system 260 is shown according to an exemplary embodiment. Safety system 260 is substantially the same as safety system 110 except for the differences discussed herein.

Briefly, safety system 260 includes a headlamp. In particular, first device 270 is the same or similar to first device 120, except that headlamp 280 is coupled to first device 270. For example, arms 274 extend upward from housing 272 of first device 270, and headlamp 280 is coupled between arms 274, such as pivotally coupled.

Safety system 260 includes power source 290 and power cord 292. Power cord 292 electrically couples power source 290 to headlamp 280 and/or detector(s), thereby providing power from power source 290 to headlamp 280 and/or detector(s) of first device 270.

Figure 9:
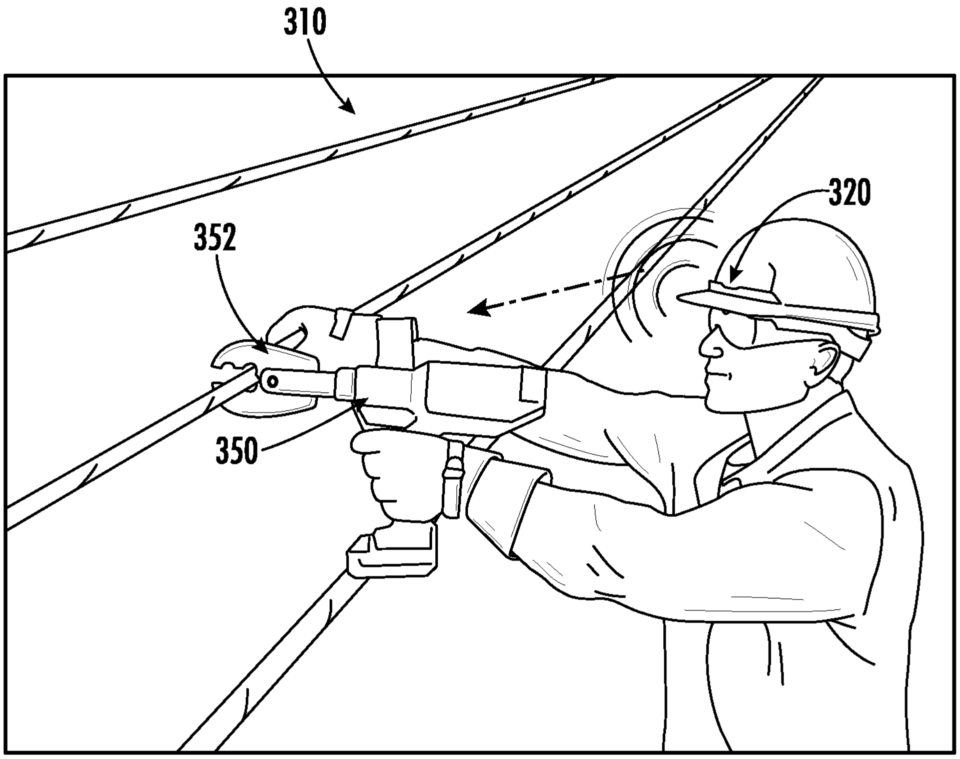
FIG. 9 depicts a safety system, according to another exemplary embodiment.

Referring to FIG. 9, safety system 310 is shown according to an exemplary embodiment. Safety system 310 is substantially the same as safety system 110 or safety system 260 except for the differences discussed herein. In particular, first device 320 is substantially the same as first device 120 except for the differences discussed herein.

When first device 320 detects a hazardous condition, such as a nearby high voltage, a warning signal is communicated to power tool 350, such as wirelessly communicated. In various embodiments, one or more functions of power tool 350 are disabled as a result of receiving the warning signal. For example, the operative component 352 (e.g., the clamp, the drill) of power tool 350 is disabled in response to receiving the warning signal.

Figure 10:
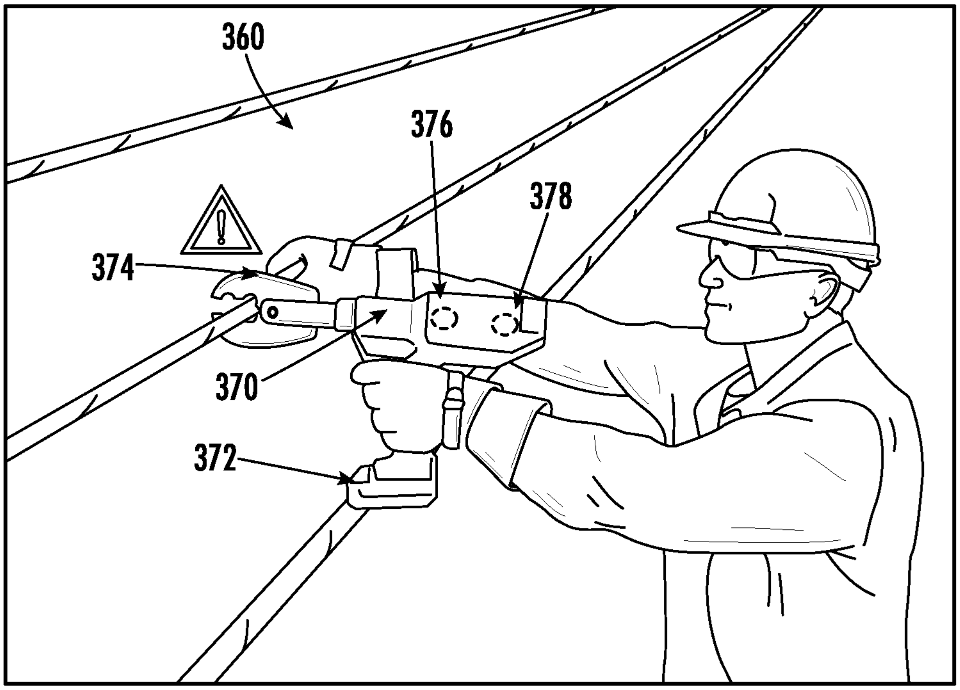
FIG. 10 depicts a power tool, according to another exemplary embodiment.

Referring to FIG. 10, power tool 360 is shown according to an exemplary embodiment. Power tool 360 is substantially the same as safety system 310 except for the differences discussed herein.

Briefly, power tool 360 includes the components and functionality of first device 320 and/or power tool 350 of safety system 310. For example, power tool 360 includes a first detector 376 coupled to housing 370 of power tool 360. When detector 376 detects a hazardous condition, one or more functions on power tool 360 are disabled. In various embodiments, power tool 360 includes housing 370, power source 372 (e.g., a battery), an operative component 374 (e.g., a clamp, a drill), a detector 376, and/or first electronics 378 (e.g., internal wiring and/or circuitry).

Figure 11:
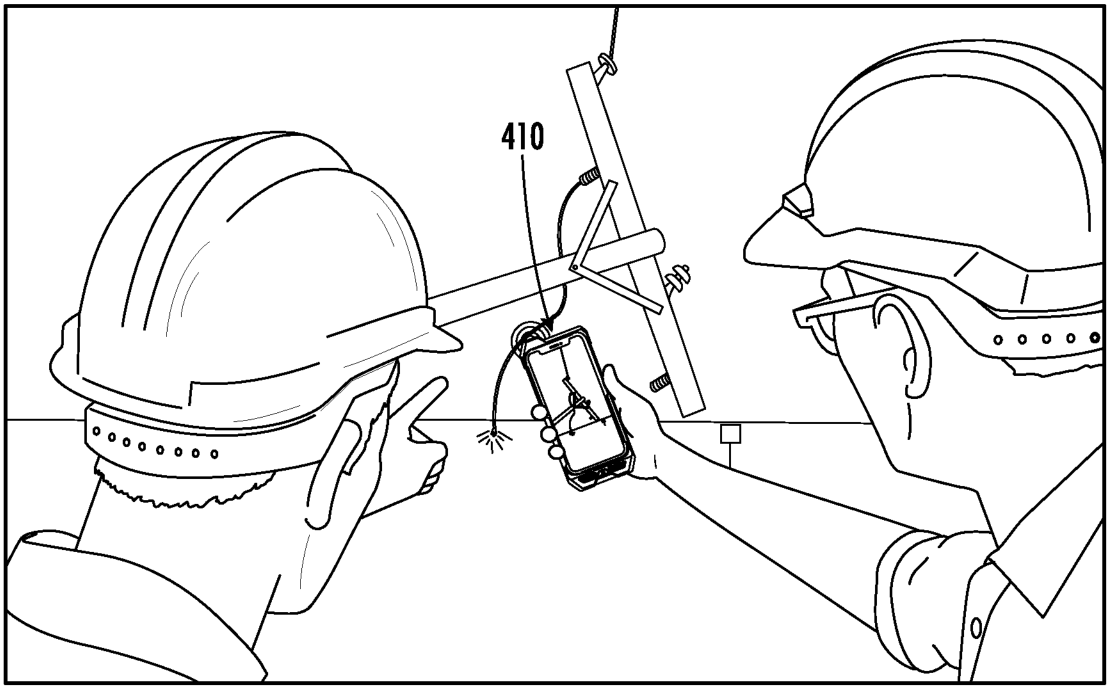
FIG. 11 depicts a safety system, according to another exemplary embodiment.
Figure 12:
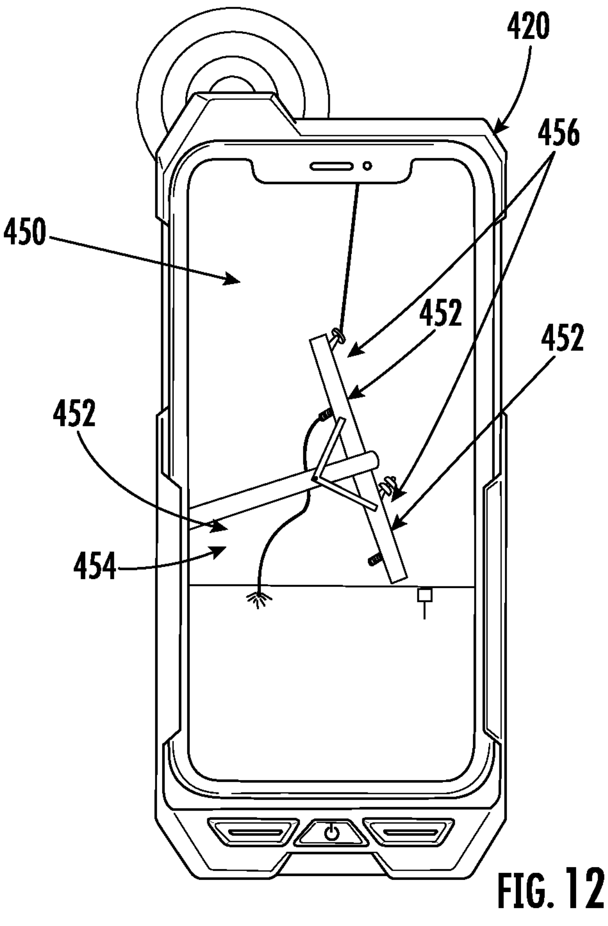
FIG. 12 depicts the safety system of FIG. 11, according to an exemplary embodiment.
Figure 13:
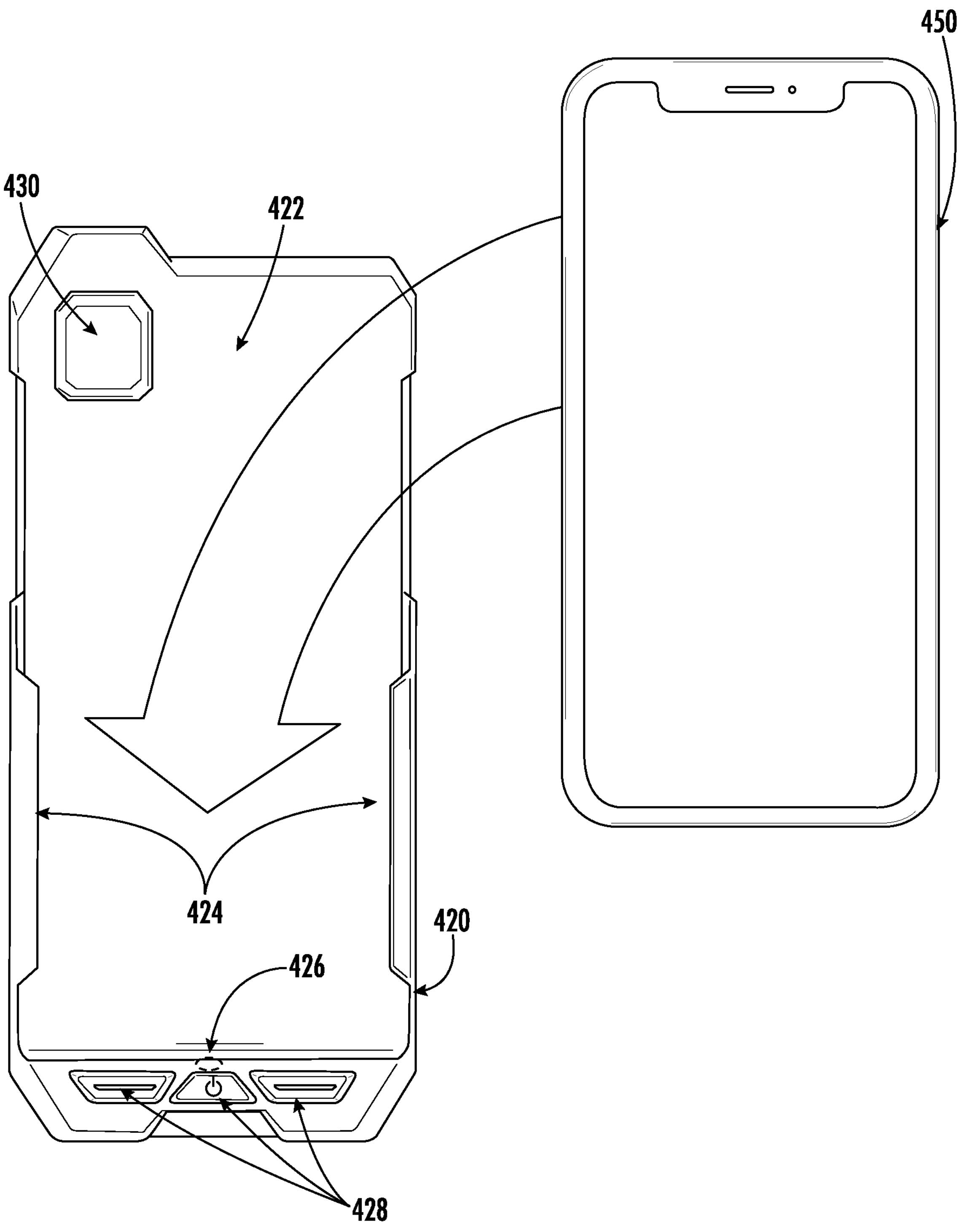
FIG. 13 depicts the safety system of FIG. 11, according to an exemplary embodiment.
Figure 14:
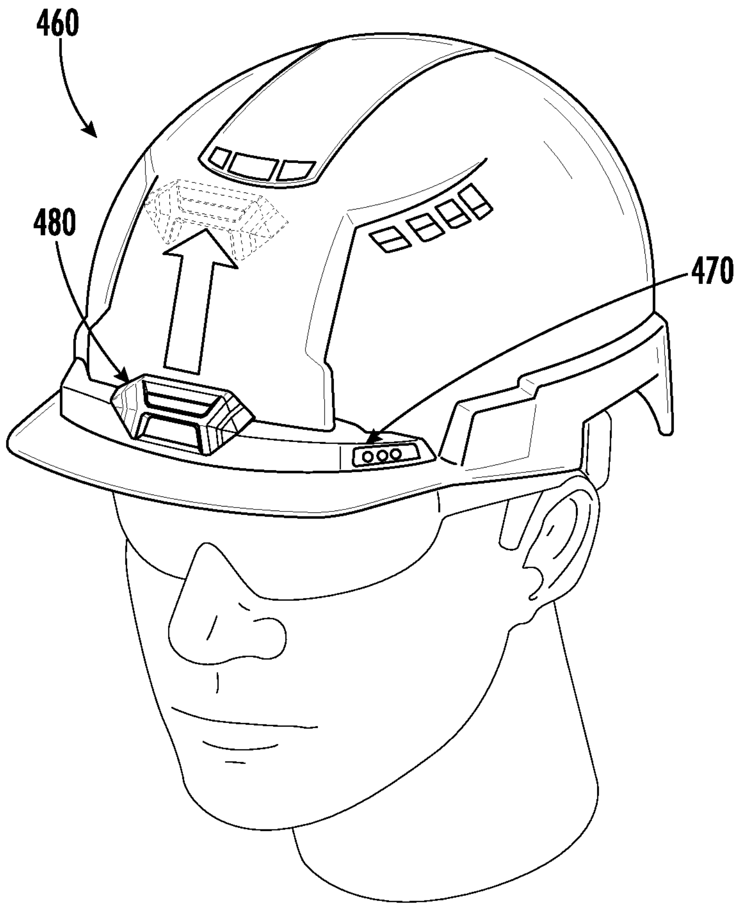
FIG. 14 depicts a safety system, according to another exemplary embodiment.
Figure 15:
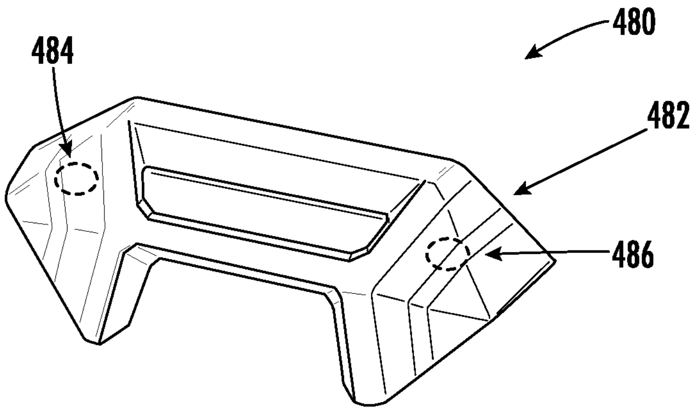
FIG. 15 depicts the safety system of FIG. 14, according to an exemplary embodiment.

Referring to FIGS. 11-13, safety system 410 is shown according to an exemplary embodiment. Safety system 410 is substantially the same as safety system 110 except for the differences discussed herein.

Safety system 410 includes a first device 420 configured to couple to a personal electronics device 450, such as a cell phone or a tablet. First device 420 includes housing 422 (e.g., a back plate), ribs 424 configured to couple the personal electronics device 450 to the housing 422, electrical interface 426 configured to electrically couple first device 420 to personal electronics device 450 (e.g., via a plug), one or more interface buttons 428, and one or more detector 430.

In various embodiments, personal electronics device 450 includes a display that includes an entire image 452 being shown. The entire image 452 includes a base image 454, which is the objects captured by a camera on personal electronics device 450, and entire image 452 includes augmented image 456, which is added to the entire image 452 by first device 420.

For example, first device 420 detects a hazardous condition and communicates that information to personal electronics device 450 via electrical interface 426. The personal electronics device 450 augments the entire image 452 to include one or more indications of the hazardous condition.

In an alternative embodiment, the hand-held device could be a single purpose all-in-one device that includes the detecting functionality of first device 420 and the display technology of personal electronics device 450.

Referring to FIGS. 14-18, safety system 460 is shown according to an exemplary embodiment. Safety system 460 is substantially the same as safety system 110, safety system 260, safety system 310, or safety system 410 except for the differences discussed herein. For example, first device 470 is the substantially the same as first device 120 of safety system 110.

In particular, module 480 is detachably coupled to first device 470. Module 480 includes detector 484 and electronics 486 coupled to housing 482. In various embodiments, module 480 is in communication with first device 470, such as wireless communications.

Figure 16:
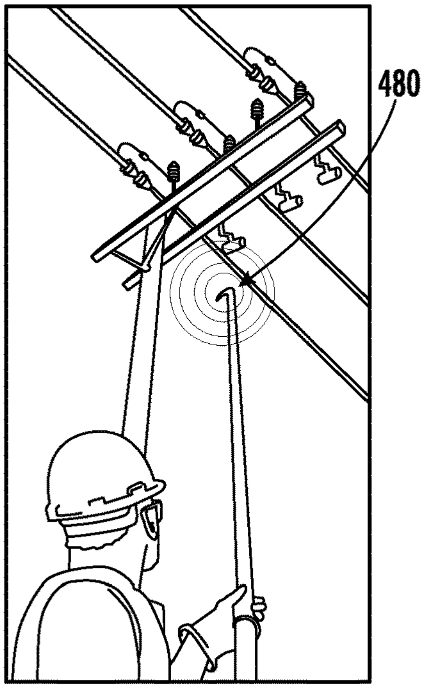
FIG. 16 depicts the safety system of FIG. 14, according to an exemplary embodiment.
Figure 17:
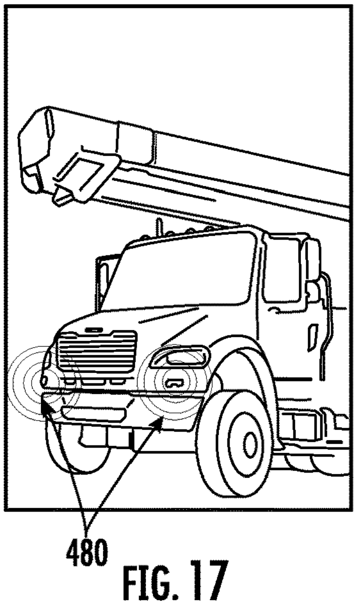
FIG. 17 depicts the safety system of FIG. 14, according to an exemplary embodiment.
Figure 18:
FIG. 18 depicts the safety system of FIG. 14, according to an exemplary embodiment.

Referring to FIGS. 16-18, module 480 can be attached to various devices to facilitate detecting hazardous conditions, such as by placing module 480 closer to the condition without requiring the person to get closer. For example, module 480 can be coupled to a hot stick (FIG. 16), the front of a vehicle (FIG. 17) to create safety zones, and/or clothing worn by a worker (FIG. 18).

Figure 19:
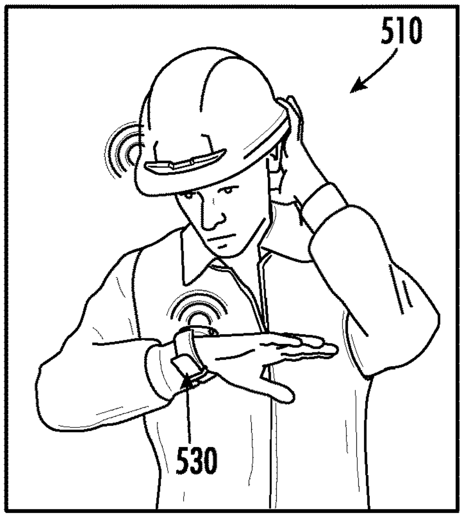
FIG. 19 depicts a safety system, according to another exemplary embodiment.
Figure 20:
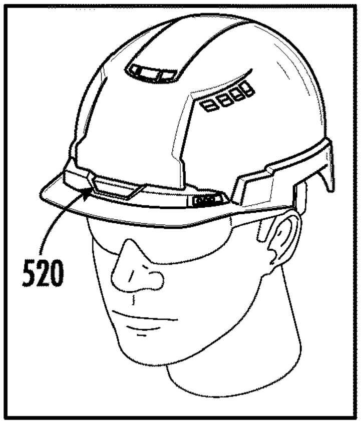
FIG. 20 depicts the safety system of FIG. 19, according to an exemplary embodiment.
Figure 21:
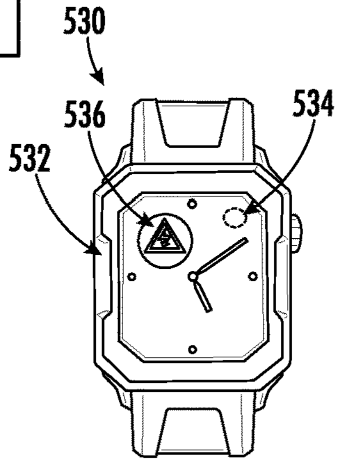
FIG. 21 depicts the safety system of FIG. 19, according to an exemplary embodiment.
Figure 22:
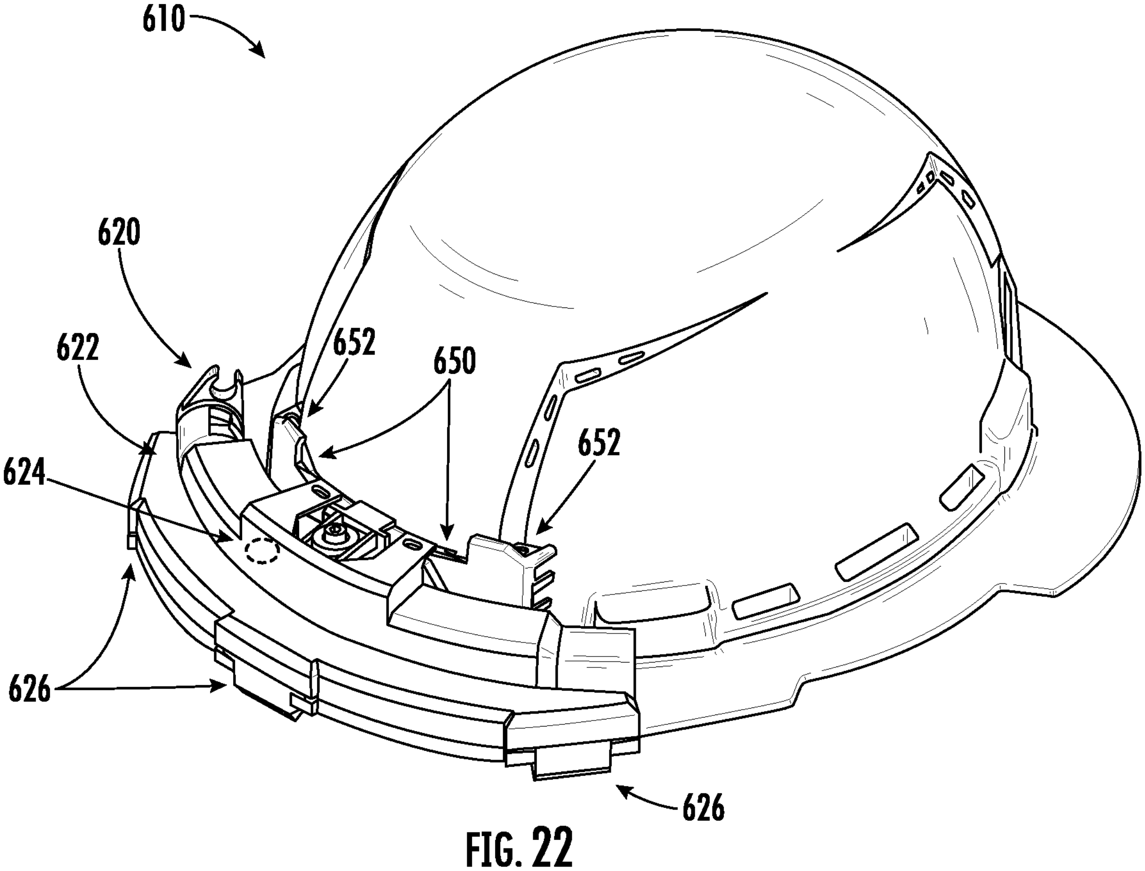
FIG. 22 is a perspective view of a safety device coupled to a safety headwear, according to an exemplary embodiment.
Figure 23:
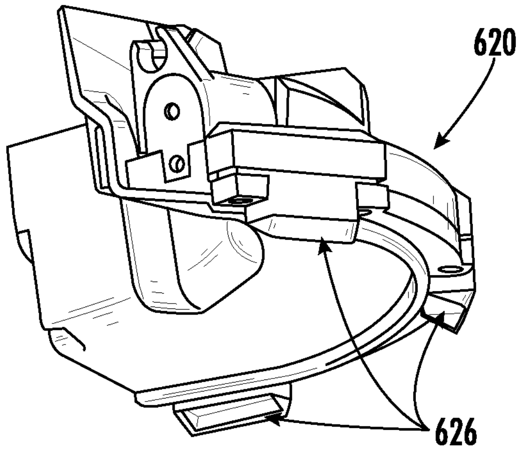
FIG. 23 is a perspective view from below of the safety device of FIG. 22, according to an exemplary embodiment.
Figure 24:
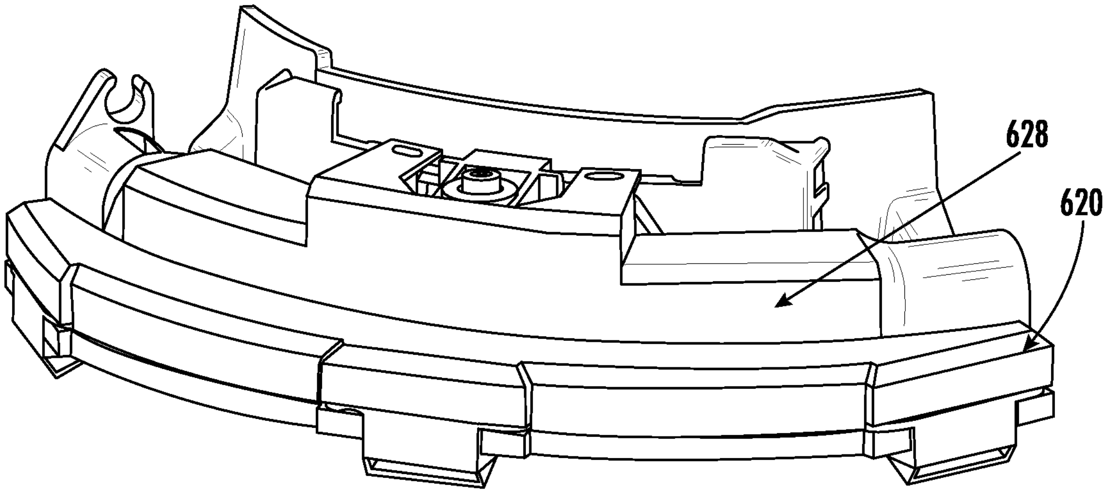
FIG. 24 is a perspective view of the safety device of FIG. 22, according to an exemplary embodiment.
Figure 25:
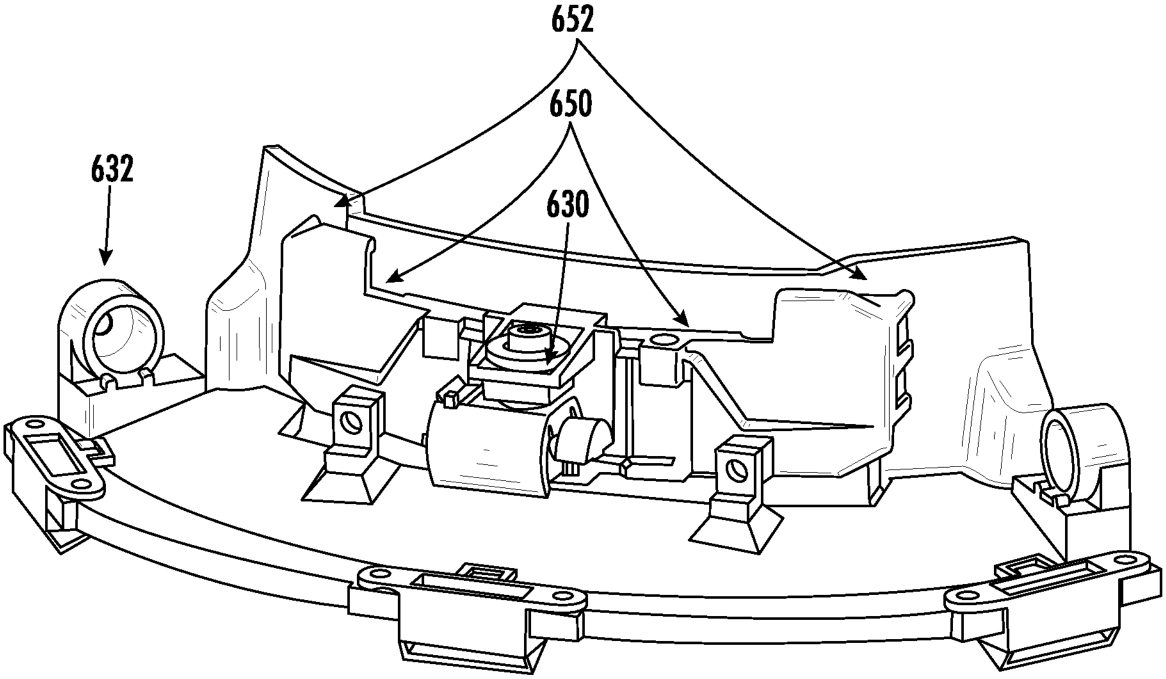
FIG. 25 is a perspective view of a portion of the safety device of FIG. 22, according to an exemplary embodiment.
Figure 26:
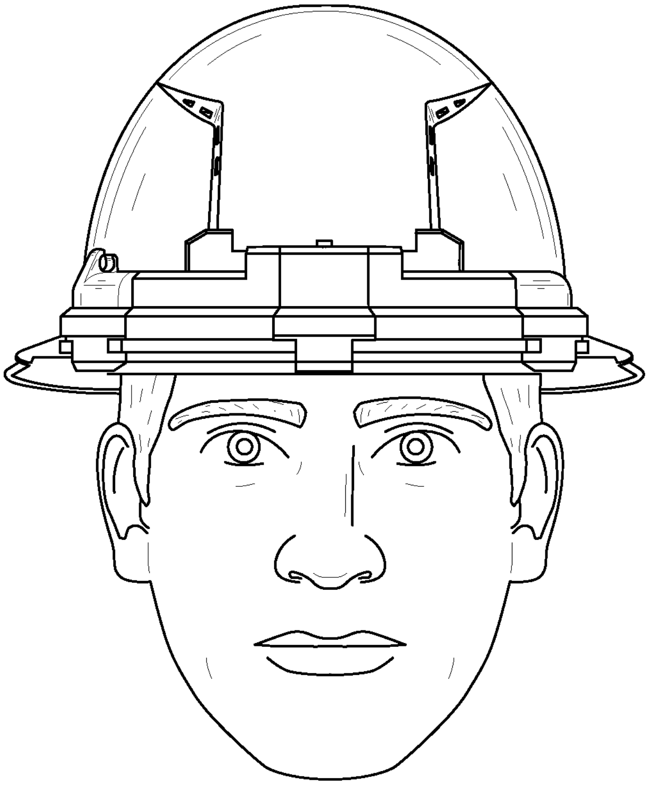
FIG. 26 is a front view of the safety device of FIG. 22, according to an exemplary embodiment.
Figure 27:
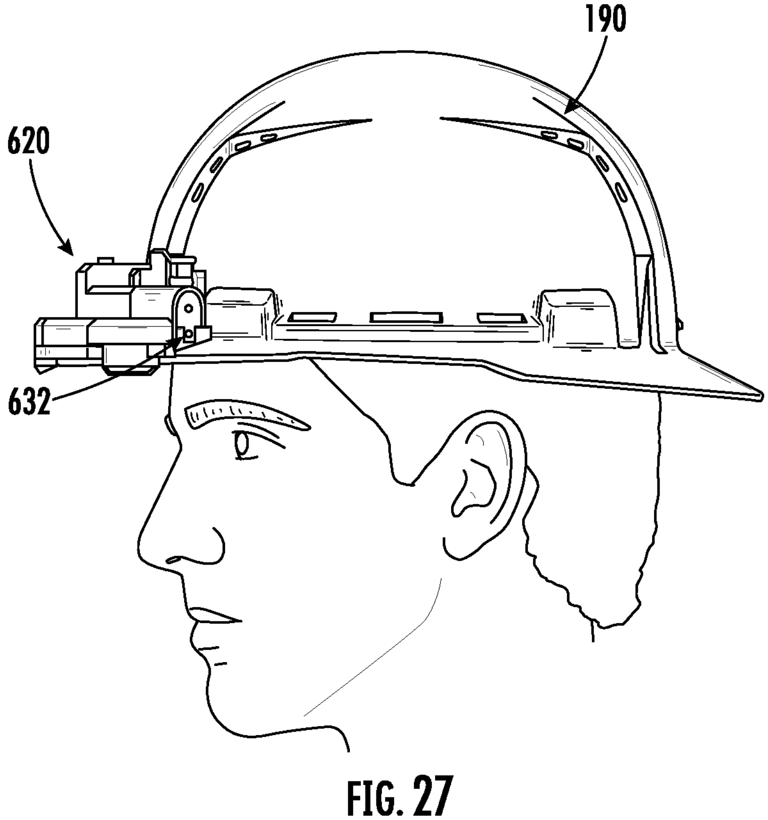
FIG. 27 is a side view of the safety device of FIG. 22, according to an exemplary embodiment.
Figure 28:
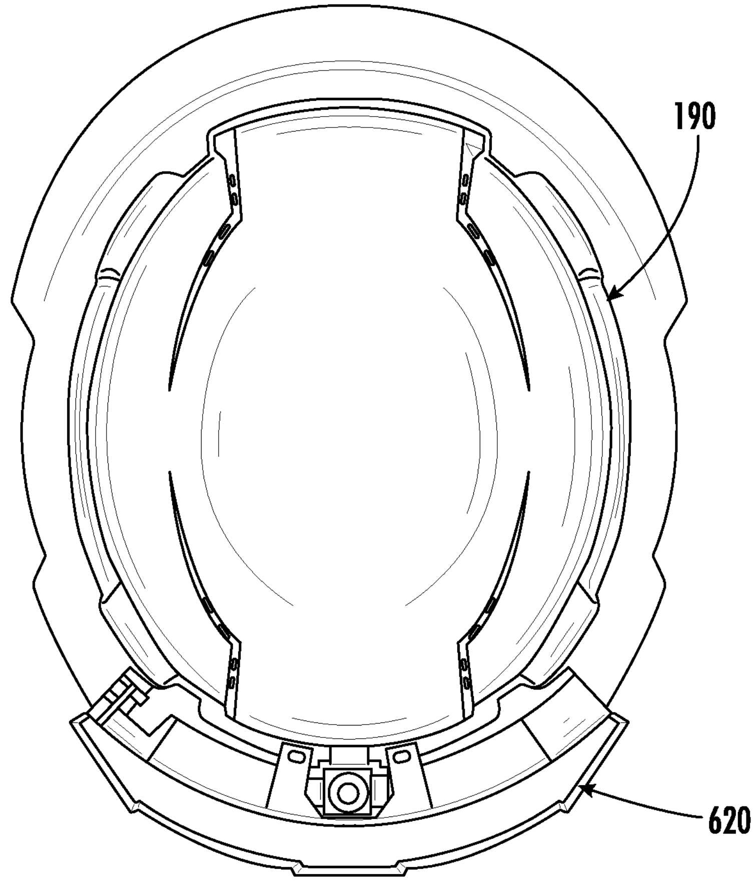
FIG. 28 is a top view of the safety device of FIG. 22, according to an exemplary embodiment.
Figure 29:
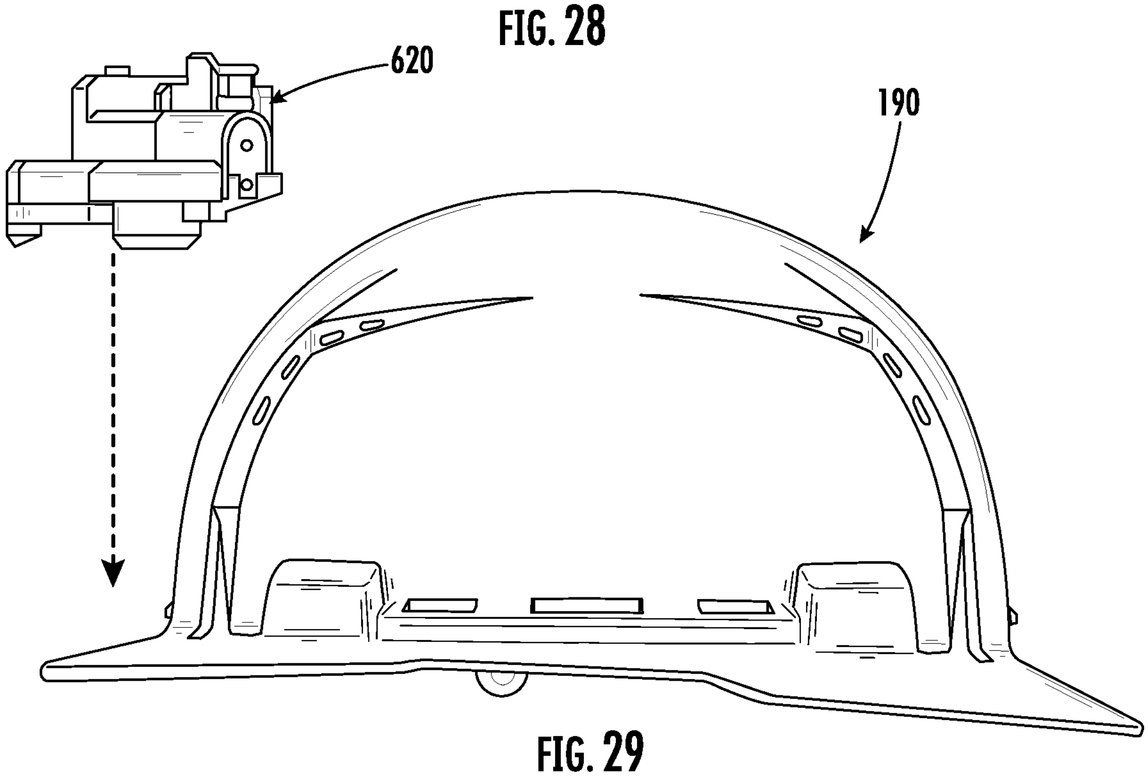
FIG. 29 is a side view of the safety device of FIG. 22, according to an exemplary embodiment.
Figure 30:
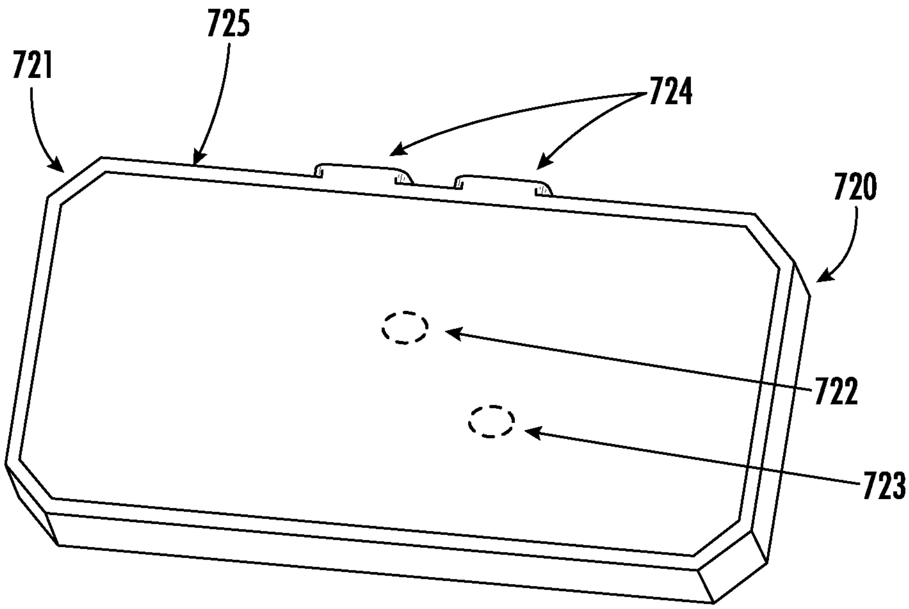
FIG. 30 is a perspective view of a safety device, according to an exemplary embodiment.
Figure 31:
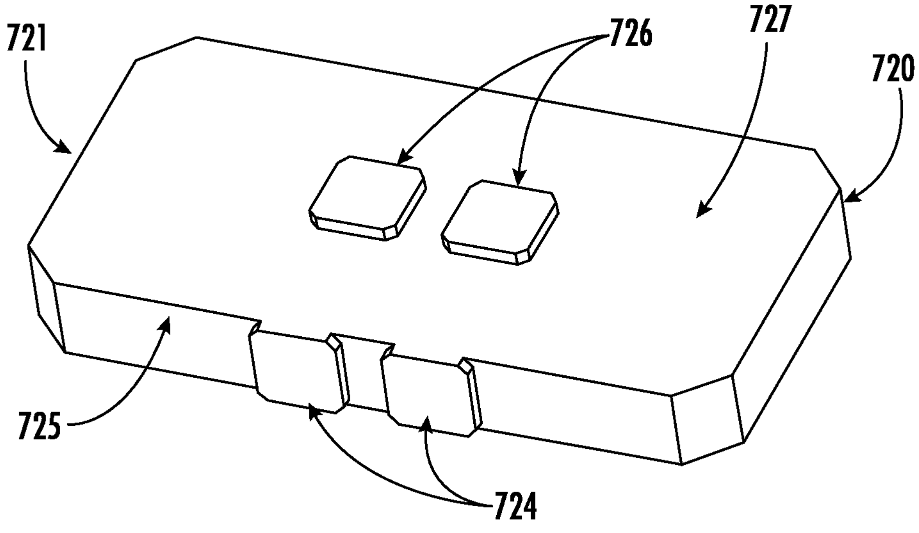
FIG. 31 is a perspective view of the safety system of FIG. 30, according to an exemplary embodiment.
Figure 32:
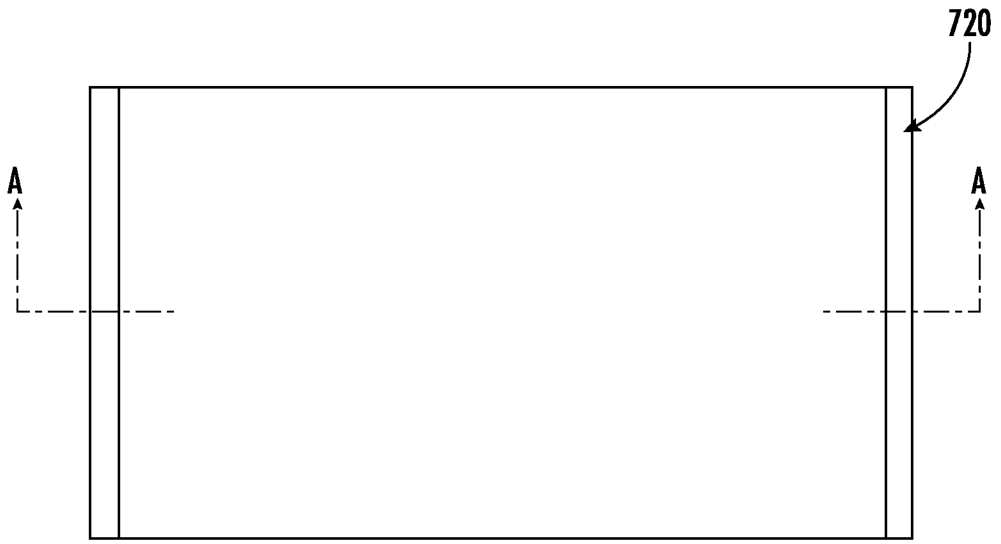
FIG. 32 is a schematic top view of the safety system of FIG. 30, according to an exemplary embodiment.
Figure 33:
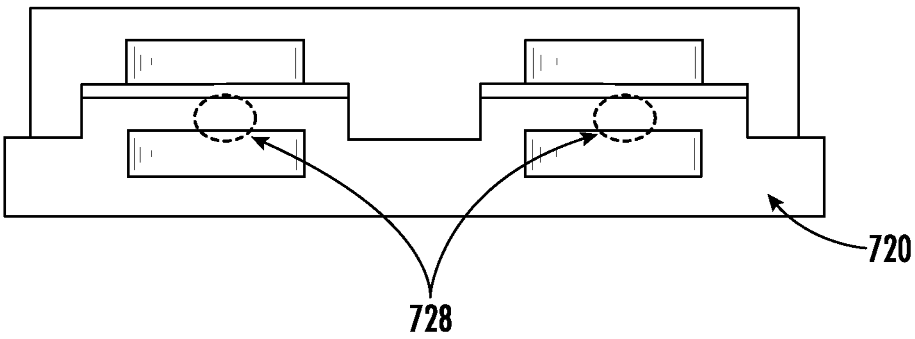
FIG. 33 is a cross-section view of the safety system of FIG. 30 coupled to an exemplary mount and shown along line A-A in FIG. 32, according to an exemplary embodiment.
Figure 34:
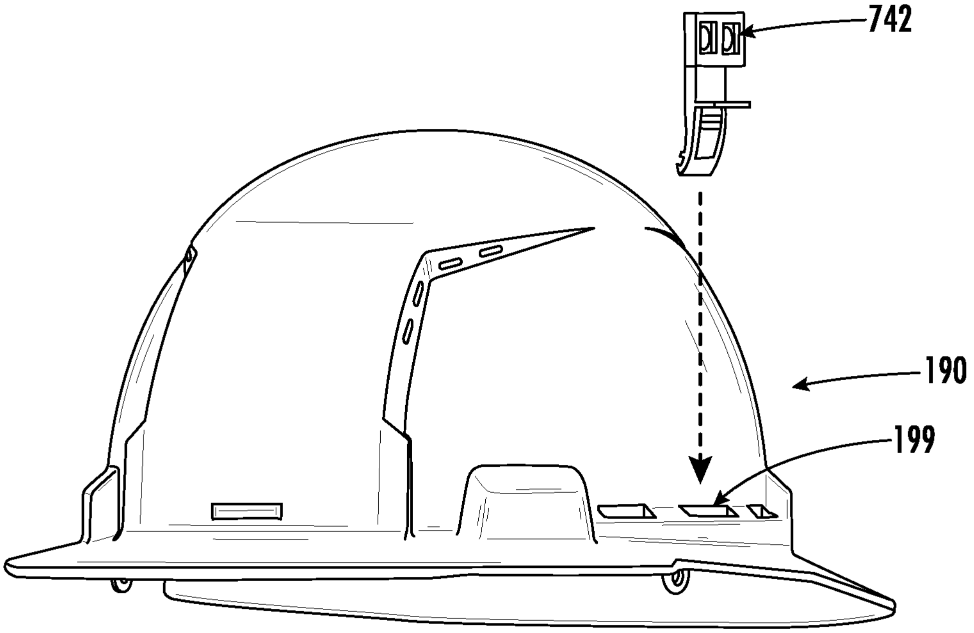
FIG. 34 is a perspective view of a mount for a safety device, according to an exemplary embodiment.
Figure 35:
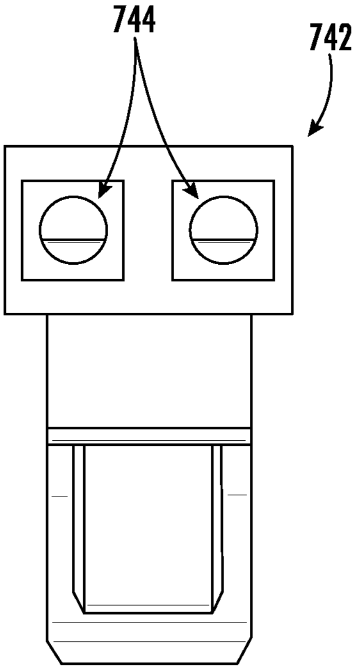
FIG. 35 is a front view of the mount of FIG. 34, according to an exemplary embodiment.
Figure 36:
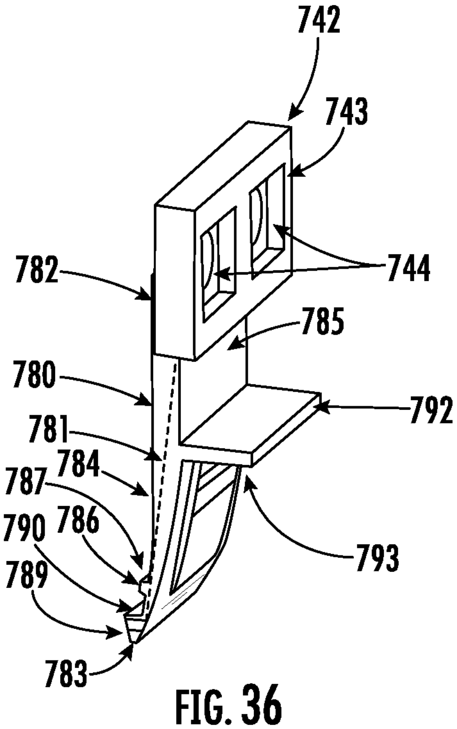
FIG. 36 is a perspective view of the mount of FIG. 34, according to an exemplary embodiment.
Figure 37:
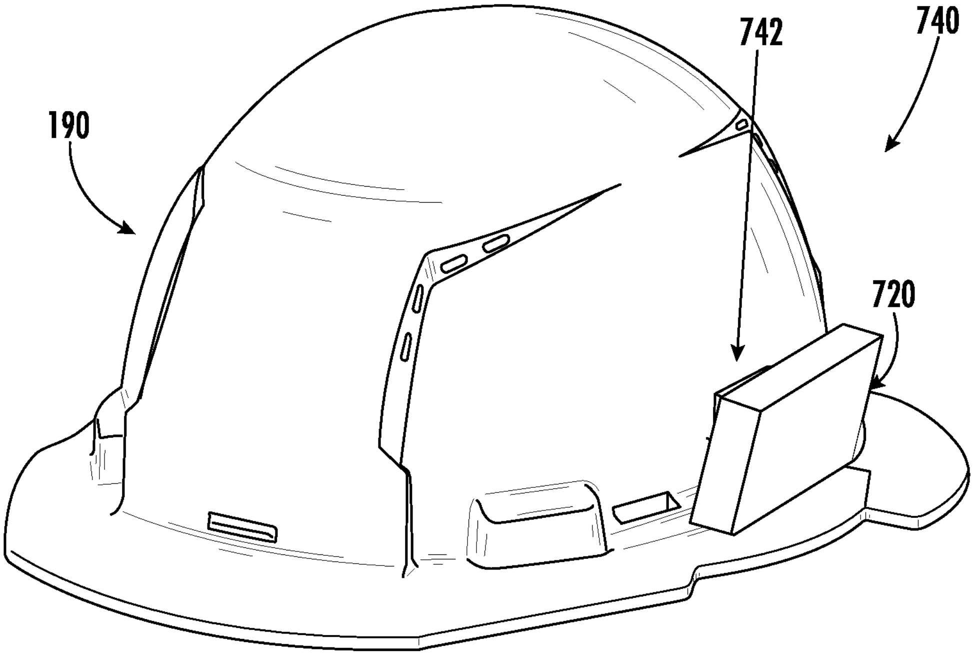
FIG. 37 is a perspective view of the mount of FIG. 34, according to an exemplary embodiment.
Figure 38:
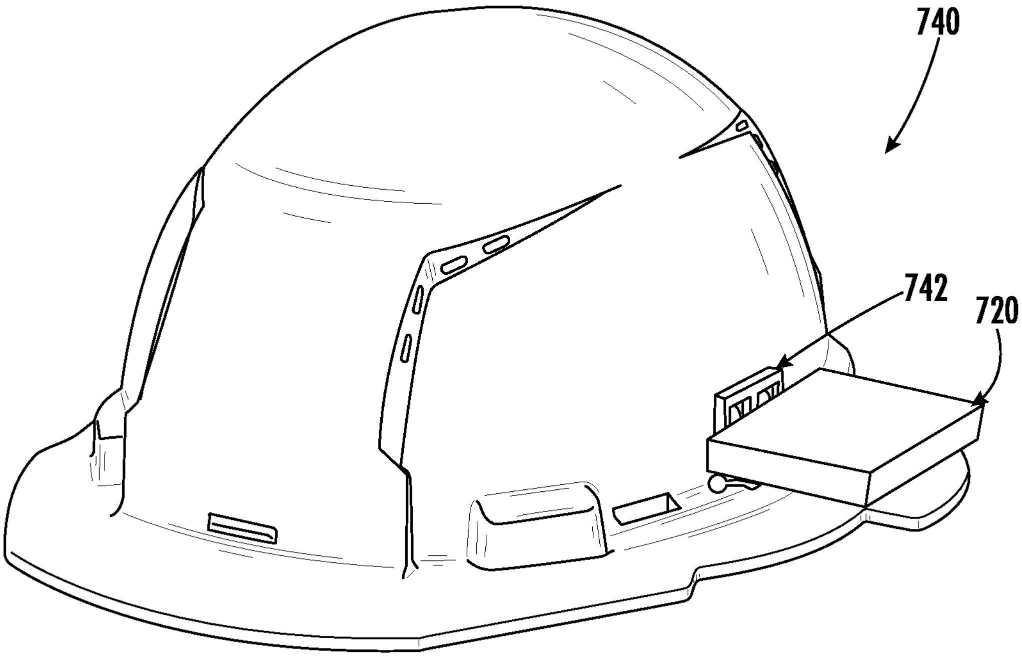
FIG. 38 is a perspective view of the mount of FIG. 34, according to an exemplary embodiment.
Figure 39:
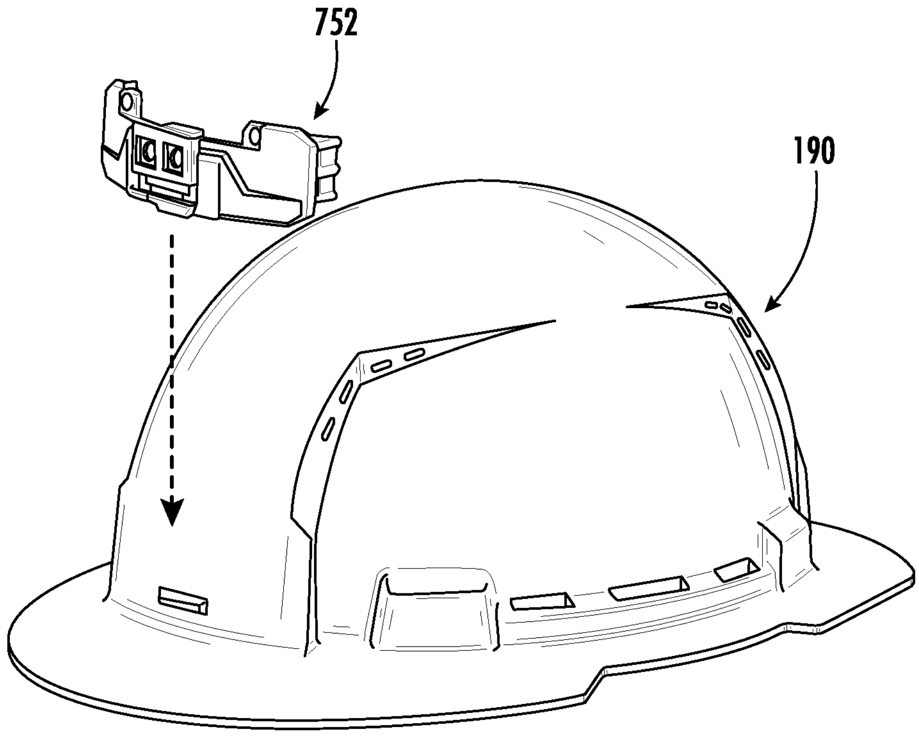
FIG. 39 is a perspective view of a mount for a safety device, according to an exemplary embodiment.
Figure 40:
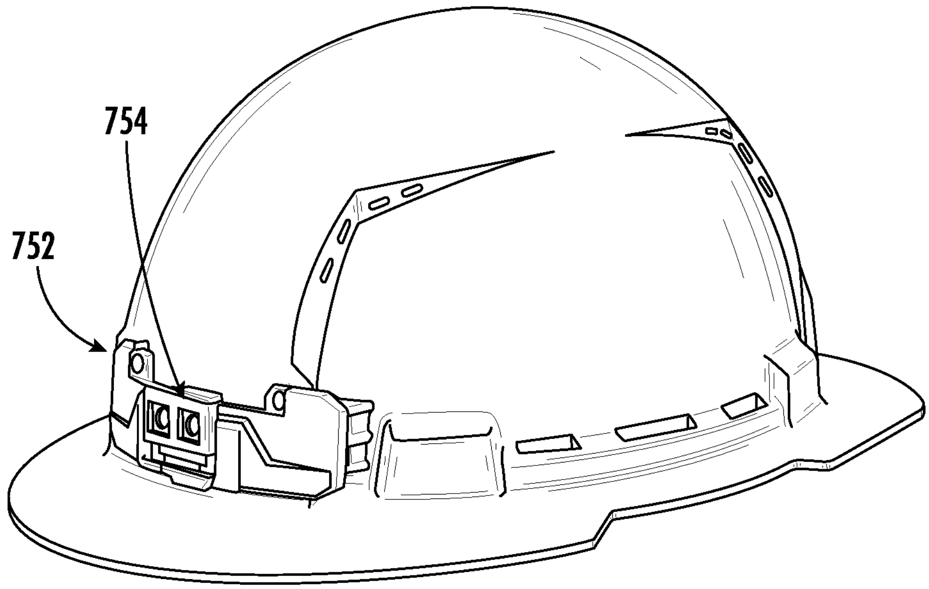
FIG. 40 is a perspective view of the mount of FIG. 39, according to an exemplary embodiment.
Figure 41:
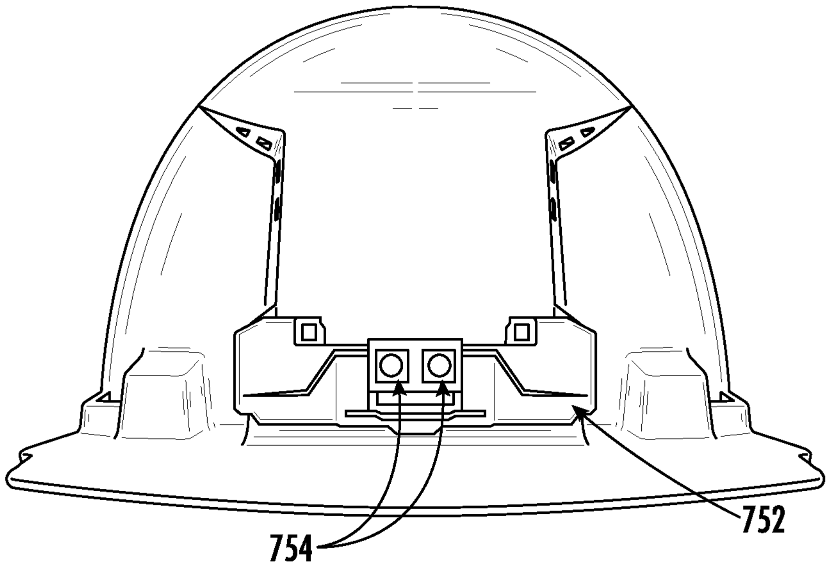
FIG. 41 is a front view of the mount of FIG. 39 coupled to a safety headwear, according to an exemplary embodiment.
Figure 42:
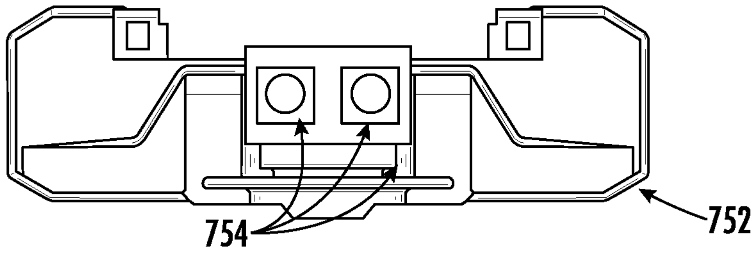
FIG. 42 is a front view of the mount of FIG. 39, according to an exemplary embodiment.
Figure 43:
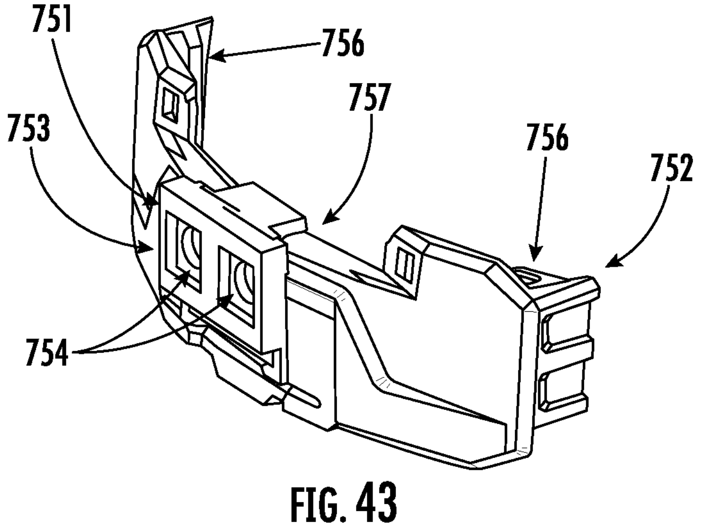
FIG. 43 is a perspective view of the mount of FIG. 39, according to an exemplary embodiment.
Figure 44:
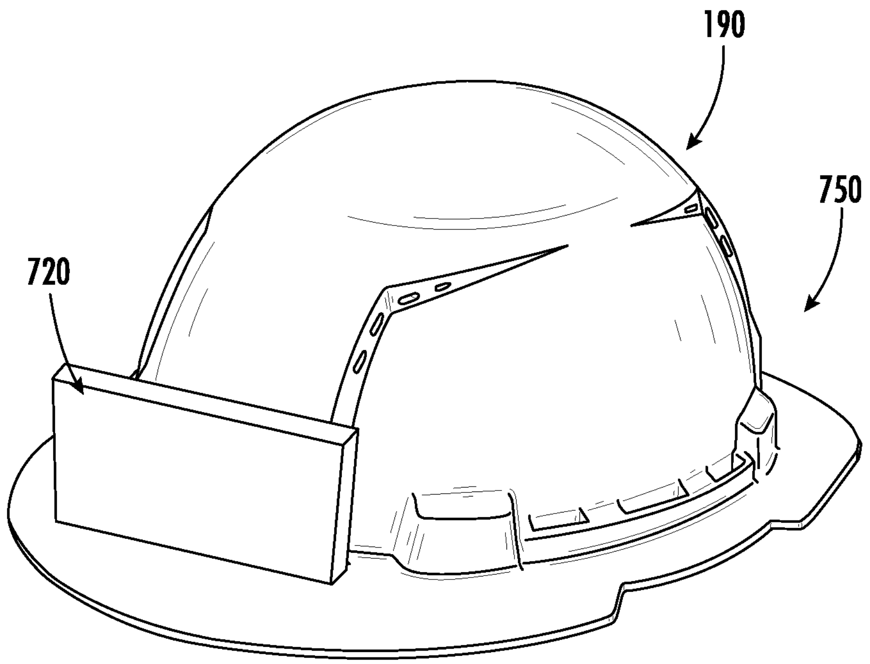
FIG. 44 is a perspective view of the mount of FIG. 39, according to an exemplary embodiment.
Figure 45:
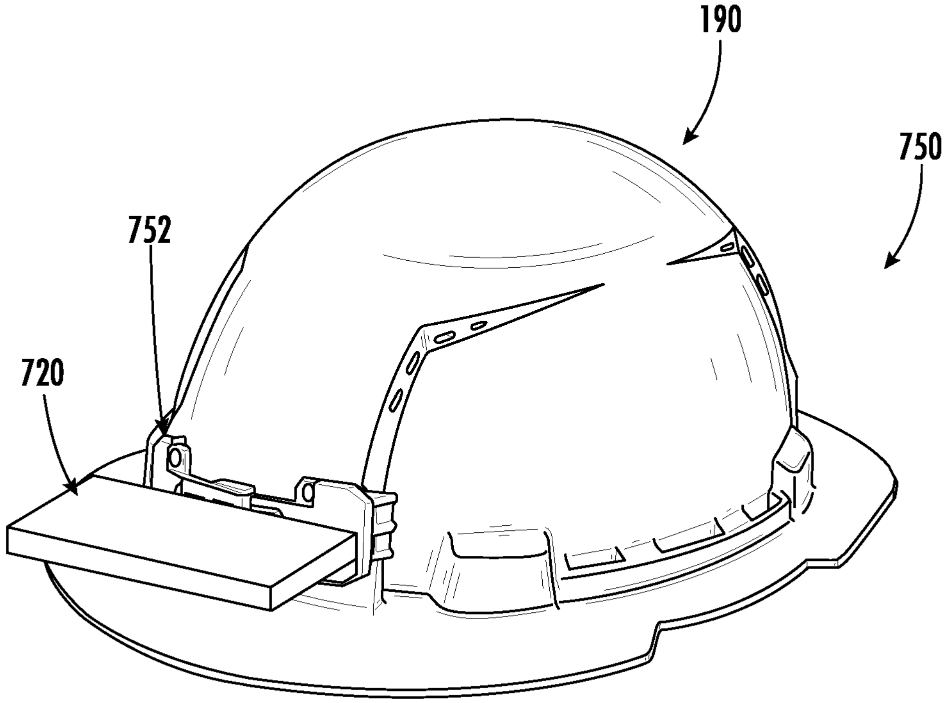
FIG. 45 is a perspective view of the mount of FIG. 39, according to an exemplary embodiment.
Figure 46:
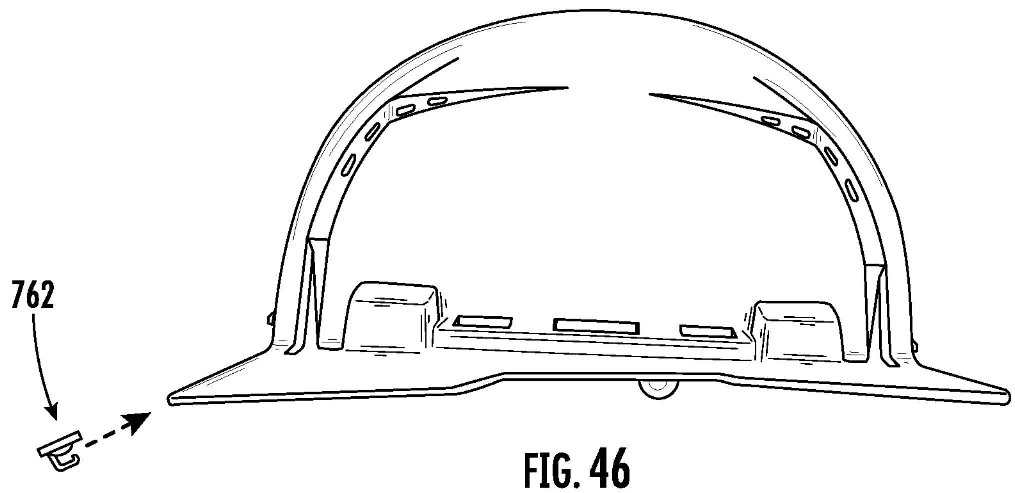
FIG. 46 is a side view of a mount for a safety device, according to an exemplary embodiment.

Referring to FIGS. 19-21, safety system 510 is shown according to an exemplary embodiment. Safety system 510 is substantially the same as safety system 110, safety device 210, safety system 260, safety system 310, or safety system 410 except for the differences discussed herein.

Safety system 510 includes first device 520. In various embodiments, first device 520 is substantially the same as first device 120 and/or first device 210. First device 520 is in wireless communication with a personal wearable device 530, such as a watch. Personal wearable device 530 includes notification device(s) 536 and electronics 534 within and/or coupled to housing 532.

Referring to FIGS. 22-29, safety device 620 is shown according to an exemplary embodiment. Safety device 620 is substantially the same as safety system 110, safety device 210, safety system 260, safety system 310, safety system 410, or safety system 510 except for the differences discussed herein.

Safety device 620 is configured to couple to safety headwear 190, such as to a front of safety headwear 190. Safety device 620 includes a coupling structure 650 that includes ribs 652. In various embodiments ribs 652 extend toward each other and engage with corresponding tongues extending from the safety headwear 190.

Safety device 620 includes housing 622 and voltage detector 624 coupled to housing 622 and configured to detect whether an object has a current with high voltage. Safety device 620 includes lighting modules 626 (e.g., LED lights), a top cover 628 coupled to a top of housing 622, haptic module 630, and speakers 632. One or more of lighting modules 626, haptic module 630, and speakers 632 are configured to emit warnings and/or signals to the user when safety device 620 detects an event, such as a nearby object having a current with high voltage.

In various embodiments, safety device 620 includes three lighting modules 626, at a left, center and right in front of the user, and one or more of the lighting modules 626 are angled inward towards the user, thereby providing better visibility by the user to see the emitted lights. In various embodiments, lighting modules 626 are positioned in the field of view for the user (see FIG. 26). In various embodiments, haptic module 630 is positioned in a center of safety device 620. In various embodiments, speakers 632 are positioned on opposing sides of safety device 620, and as a result are positioned near the user's ears to facilitate the user hearing any sounds emitted by speakers 632 (see FIG. 27).

Referring to FIGS. 30-33, safety device 720 is shown according to an exemplary embodiment. Safety system 720 is substantially the same as safety system 110, safety device 210, safety system 260, safety system 310, safety system 410, safety system 510, or safety device 620 except for the differences discussed herein.

Safety device 720 includes housing 721, controller 723 coupled to housing 721, voltage detector 722 coupled to housing 721 and in electrical communications with controller 723, upper male couplers 724, lateral male couplers 726, and magnets 728. Detector 722 is configured to generate a first signal in response to detecting nearby objects having currents with a high voltage. In various embodiments one or more of upper male couplers 724 and lateral male couplers 726 are protrusions, such as square-shaped protrusions, configured to be received within corresponding recesses or apertures. In various embodiments, safety device 720 includes upper male couplers 724 extending from a first surface 725 of housing 721, and lateral male couplers 726 extending from a second surface 727 of the first housing 721 distinct from the first surface 725.

In various embodiments, safety device 720 includes magnets 728 configured to magnetically bias the safety device 720 to remain coupled to another object, such as one of adaptor 742 (FIGS. 34-38), adaptor 752 (FIGS. 39-45), mount 762 (FIGS. 46-53), and mount 772 (FIGS. 54-57).

Referring to FIGS. 34-38, safety system 740 is shown according to an exemplary embodiment. Safety system 740 is substantially the same as safety system 110, safety device 210, safety system 260, safety system 310, safety system 410, safety system 510, or safety device 620 except for the differences discussed herein.

Safety system 740 includes adaptor 742, safety device 720, safety headwear 190, and channel 199 defined by safety headwear 190. Adaptor 742 is received in channel 199. Adaptor includes arm 780 extending along a primary longitudinal axis 781 between a first end 782 and an opposing second end 783, and a platform 743 coupled to the first end 782 of the arm 780. Arm 780 of adaptor 780 further includes a first ledge 786 extending from a first side 784 of the arm 780, a second ledge 789 extending from the first side 784 of the arm 780, and a third ledge 792 extending from a second side 785 of the arm 780 opposite the first side 784. Platform 743 is configured to couple to an accessory for the hard hat (e.g., safety device 720). First ledge 786 includes a first coupling surface 787 facing upward, the second ledge 789 includes a second coupling surface 790 facing upward and away from the first ledge 786. First ledge 786 and second ledge 789 are closer to the second end 783 of the arm 780 than the third ledge 792. In use, at least one of the first coupling surface 787 and the second coupling surface 790 interfaces with the safety headwear 190 to secure adaptor 742 to safety headwear 190. Third ledge 792 includes a lower surface 793 facing downward that interfaces against the safety headwear 190.

Platform 743 of adaptor 742 includes female couplers 744 configured to receive one of upper male couplers 724 and lateral male couplers 726 to thereby couple (e.g., rigidly couple) safety device 720 to adaptor 742. In various embodiments, female couplers 744 face away from first side 784 of arm 780. Adaptor 742 includes one or more internal ribs 746 that extend away from the head of the user. The internal ribs 746 are configured to engage with safety headwear 190, thereby securing adaptor 742 to safety headwear 190. Adaptor 742 also includes a third ledge 792 that extends away from the head of the user. Safety device 720 can be coupled to adaptor 742 in a vertical orientation (FIG. 37) in which lateral male couplers 726 are coupled to female couplers 744, or a horizontal orientation (FIG. 38) distinct from the vertical orientation in which upper male couplers 724 are coupled to female couplers 744. In various embodiments, upper male couplers 724 are coupled to platform 743 when the safety device 720 is in the first orientation, and the lateral male couplers 726 are coupled to platform 743 when the safety device 720 is in the second orientation. In various embodiments, the third ledge 792 extends from the second side 785 of the arm 780 further than the first ledge 786 and the second ledge 789 extend from the first side 784 of arm 780.

Referring to FIGS. 39-45, safety system 750 is shown according to an exemplary embodiment. Safety system 750 is substantially the same as safety system 110, safety device 210, safety system 260, safety system 310, safety system 410, safety system 510, safety device 620, or safety system 740 except for the differences discussed herein.

Safety system 750 includes adaptor 752, safety device 720, and safety headwear 190. Adaptor 752 includes platform 751 including female couplers 754 configured to receive one of upper male couplers 724 and lateral male couplers 726 to thereby couple (e.g., rigidly couple) safety device 720 to adaptor 752. In various embodiments, female couplers 754 are configured to face away from safety headwear 190. Adaptor 752 includes protrusions 756 configured to couple adaptor 752 to safety headwear 190. In various embodiments, protrusions 756 extend toward each other and engage with corresponding tongues extending from the safety headwear 190 (e.g., to the shell of safety headwear 190). Safety device 720 can be coupled to adaptor 752 in a vertical orientation (FIG. 44) in which lateral male couplers 726 are coupled to female couplers 754, or a horizontal orientation (FIG. 45) in which upper male couplers 724 are coupled to female couplers 754. In various embodiments, housing 753 defines back surface 757 facing towards safety headwear 190, the pair of protrusions 756 extending over the back surface 757.

Referring to FIGS. 46-53, safety system 760 is shown according to an exemplary embodiment. Safety system 760 is substantially the same as safety system 110, safety device 210, safety system 260, safety system 310, safety system 410, safety system 510, safety device 620, safety system 740 or safety system 750 except for the differences discussed herein.

Figure 47:
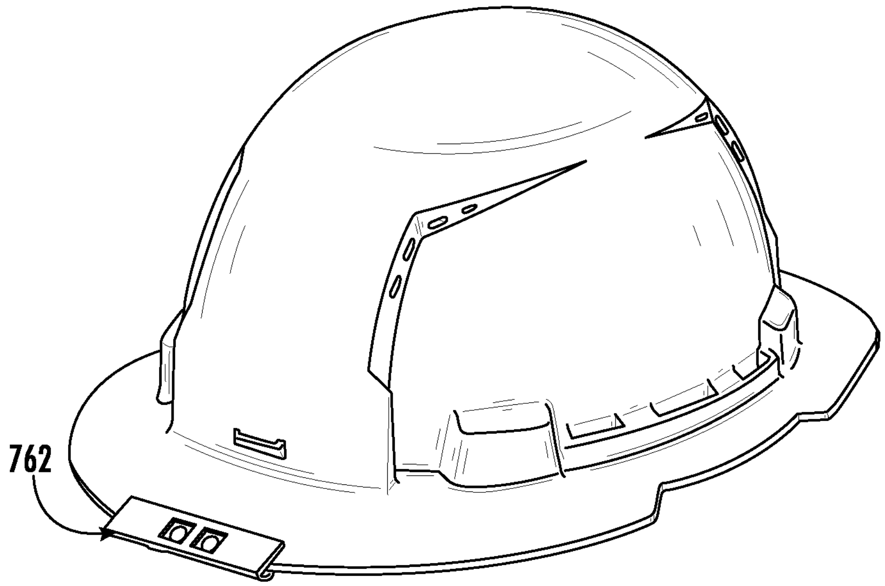
FIG. 47 is a perspective view of the mount of FIG. 46 coupled to a safety headwear, according to an exemplary embodiment.
Figure 48:
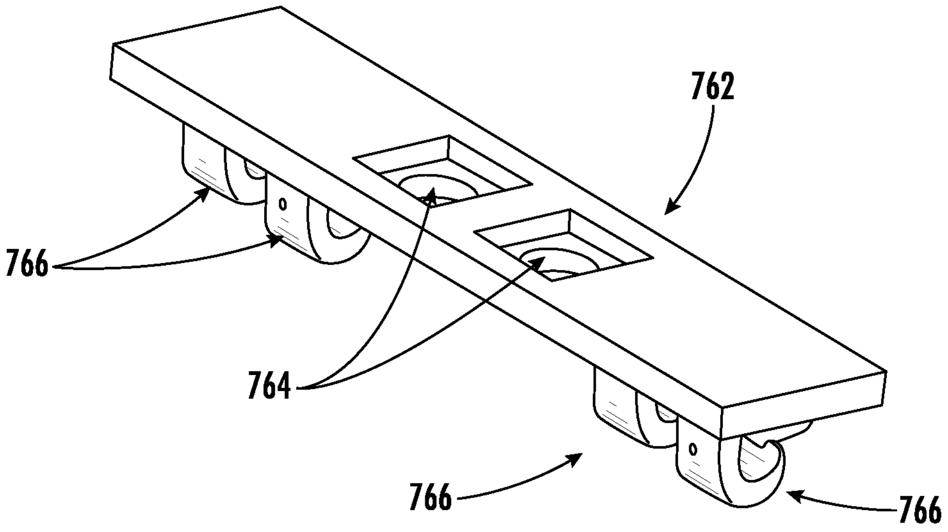
FIG. 48 is a perspective view of the mount of FIG. 46, according to an exemplary embodiment.
Figure 49:
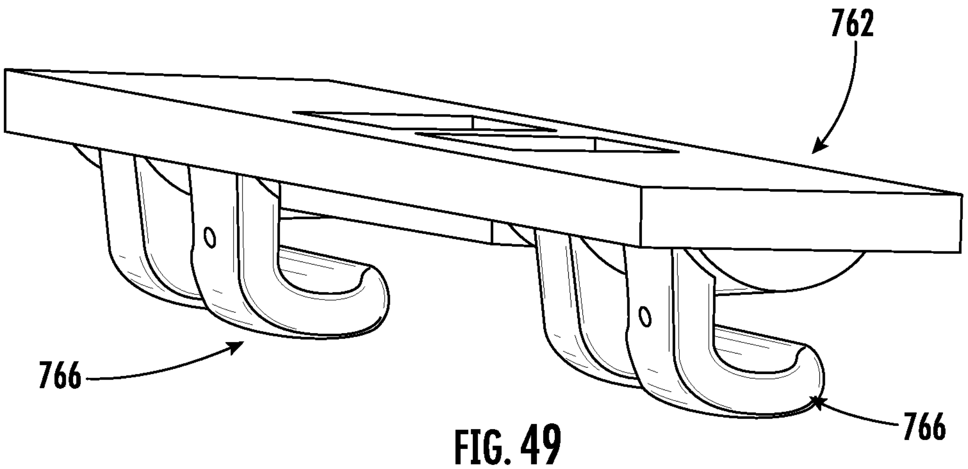
FIG. 49 is a perspective view of the mount of FIG. 46, according to an exemplary embodiment.
Figure 50:
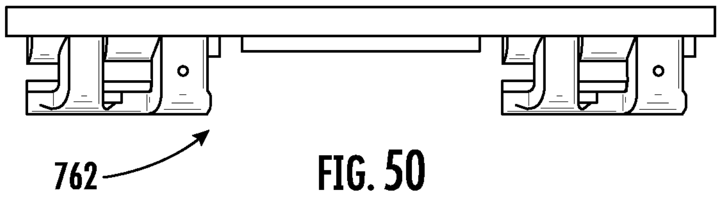
FIG. 50 is a top view of the mount of FIG. 46, according to an exemplary embodiment.
Figure 51:
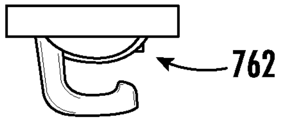
FIG. 51 is a side view of the mount of FIG. 46, according to an exemplary embodiment.
Figure 52:
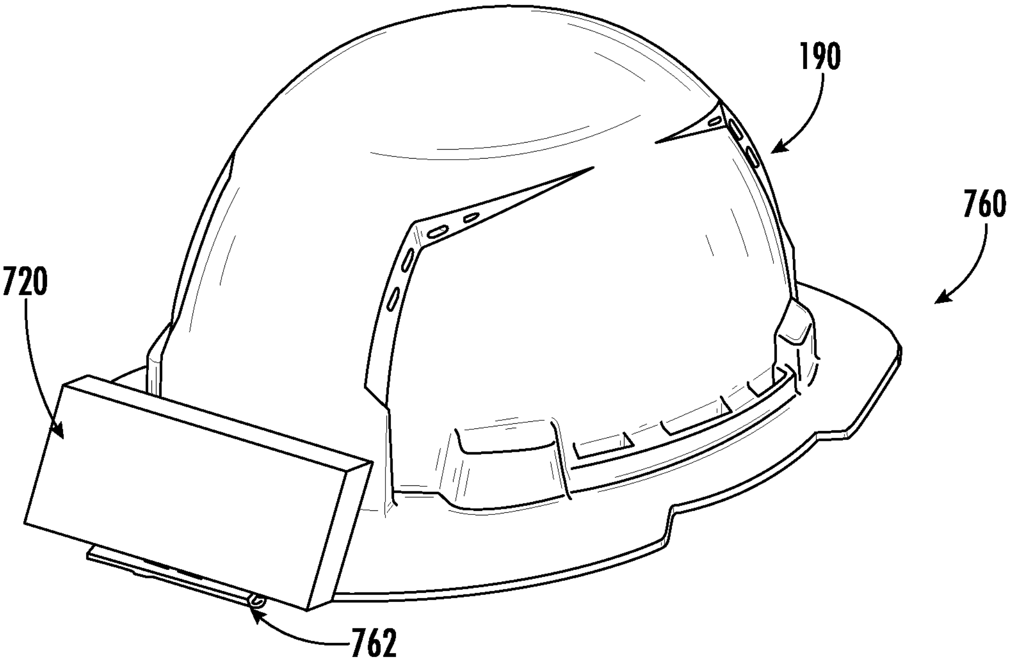
FIG. 52 is a perspective view of the mount of FIG. 46, according to an exemplary embodiment.
Figure 53:
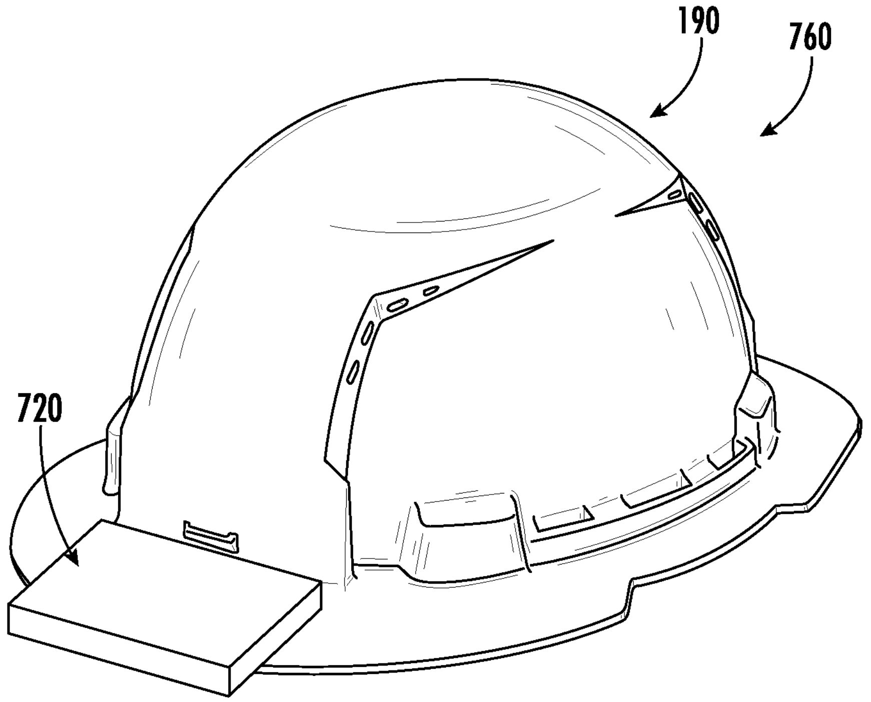
FIG. 53 is a perspective view of the mount of FIG. 46, according to an exemplary embodiment.

Safety system 760 includes mount 762 and safety device 720. Mount 762 includes female couplers 764 configured to receive one of upper male couplers 724 and lateral male couplers 726 to thereby couple (e.g., rigidly couple) safety device 720 to mount 762. Mount 762 includes ribs 766 configured to couple mount 762 to safety headwear 190, such as to a brim of safety headwear 190 (FIG. 47). Safety device 720 can be coupled to mount 762 in a vertical orientation (FIG. 52) in which lateral male couplers 726 are coupled to female couplers 764, or a horizontal orientation (FIG. 53) in which upper male couplers 724 are coupled to female couplers 764.

Referring to FIGS. 54-57, safety system 770 is shown according to an exemplary embodiment. Safety system 770 is substantially the same as safety system 110, safety device 210, safety system 260, safety system 310, safety system 410, safety system 510, safety device 620, safety system 740, safety system 760 or safety system 770 except for the differences discussed herein.

Figure 54:
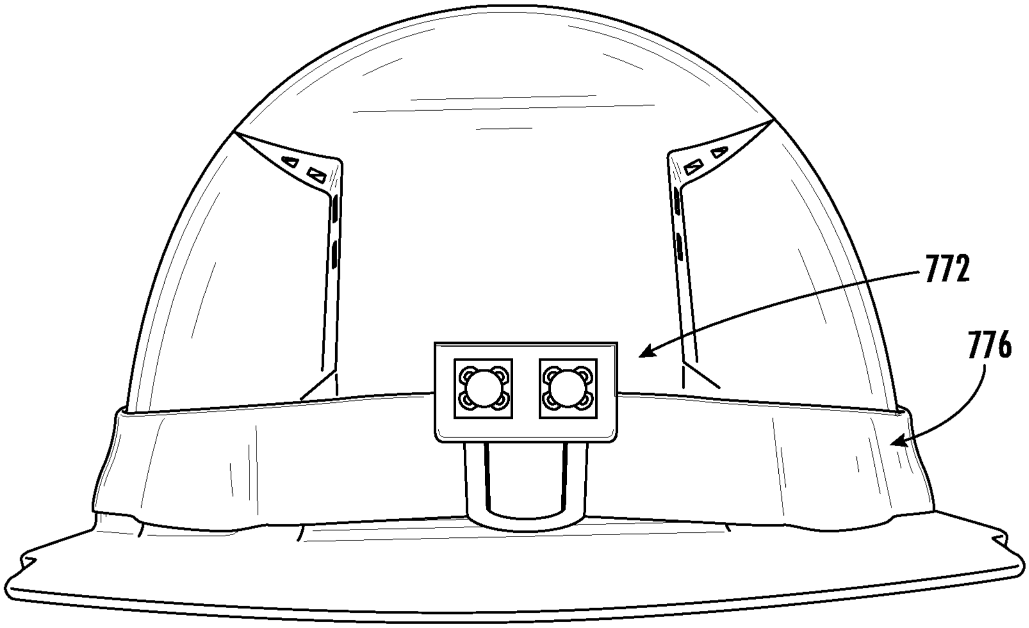
FIG. 54 is a front view of a mount for a safety device shown coupled to a safety headwear, according to an exemplary embodiment.
Figure 55:
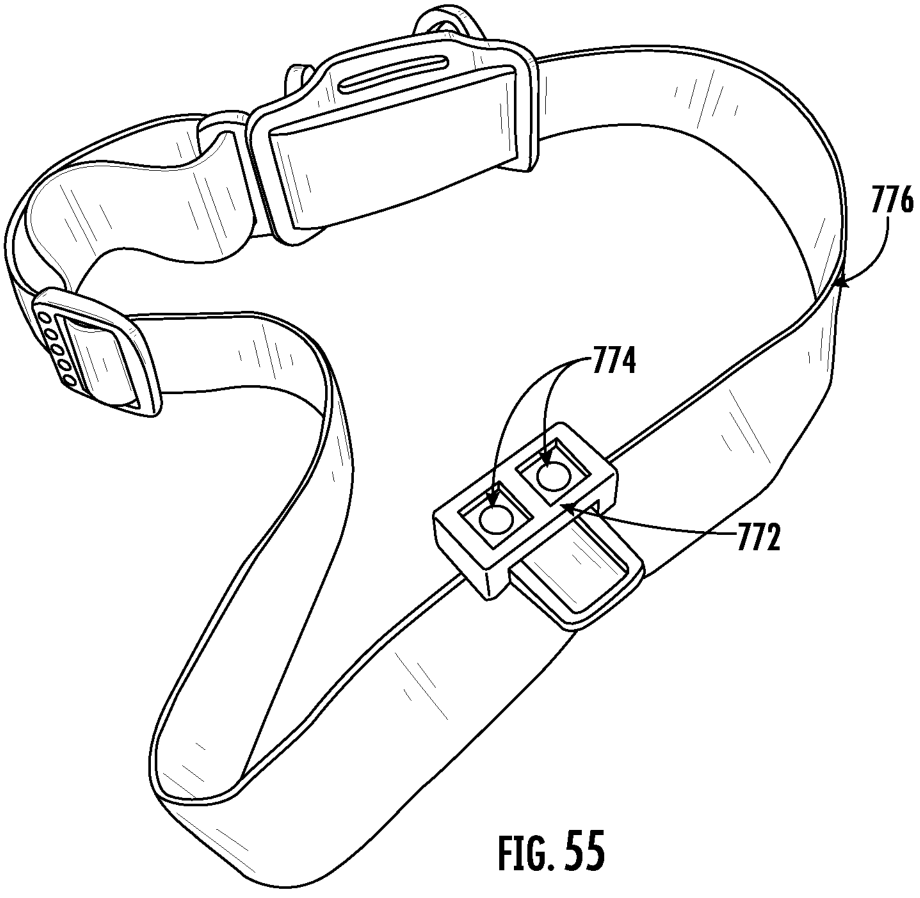
FIG. 55 is a perspective view of the mount of FIG. 54, according to an exemplary embodiment.
Figure 56:
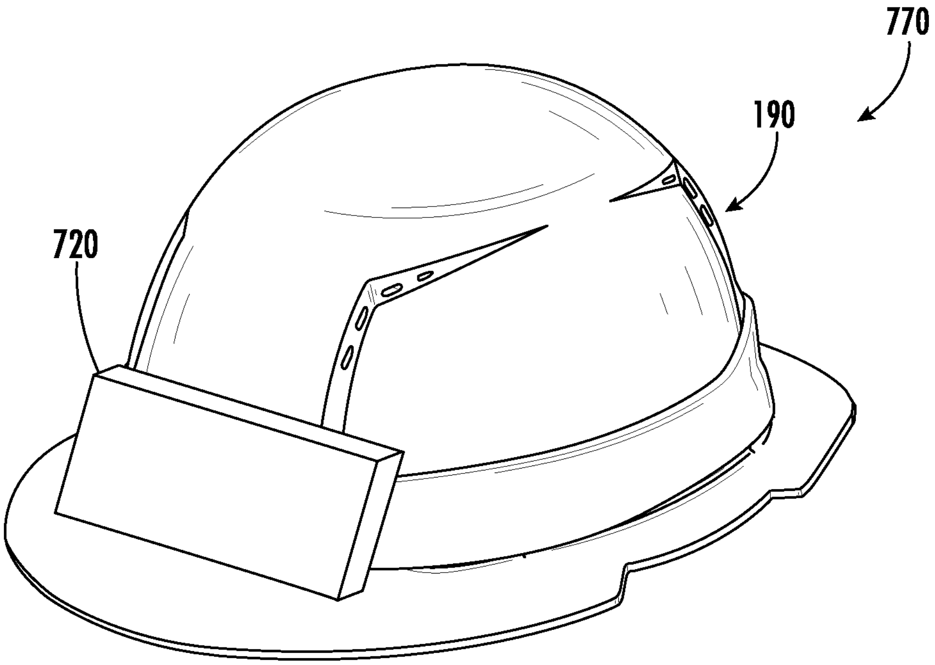
FIG. 56 is a perspective view of the mount of FIG. 54, according to an exemplary embodiment.
Figure 57:
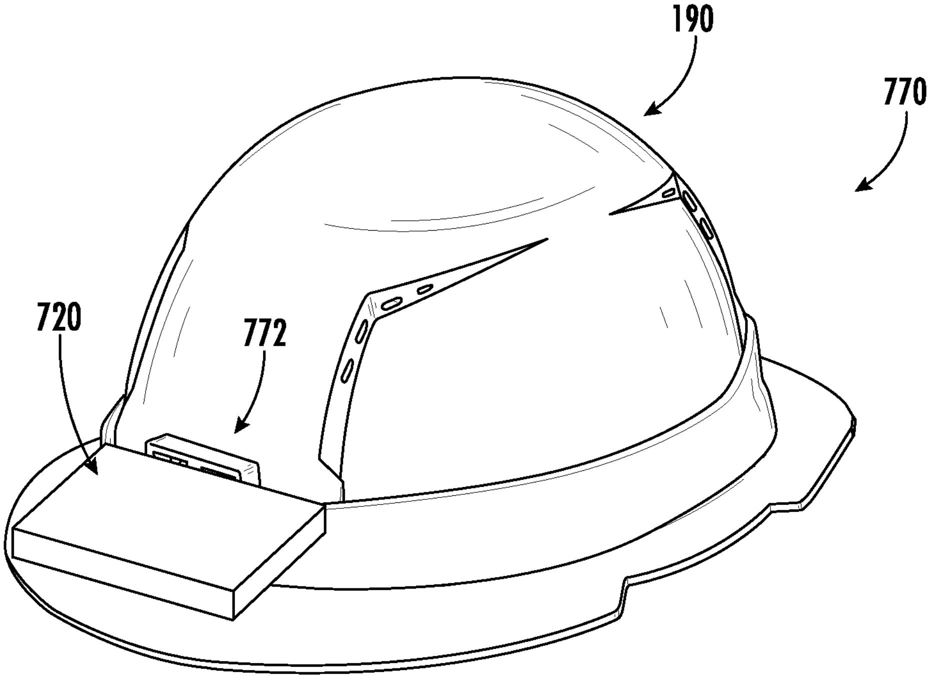
FIG. 57 is a perspective view of the mount of FIG. 54, according to an exemplary embodiment.
Figure 58:
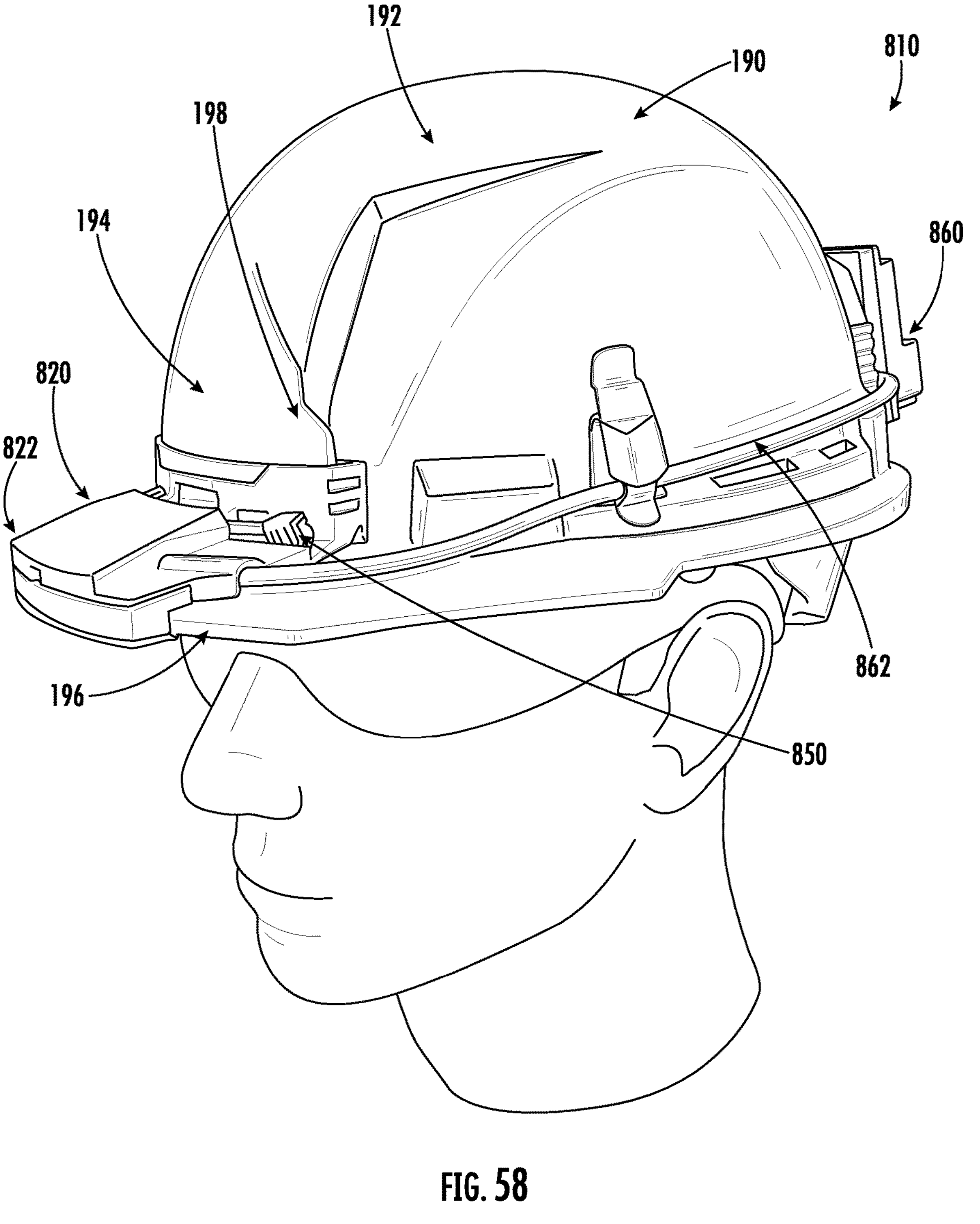
FIG. 58 is a perspective view of a safety system, according to another exemplary embodiment.

Safety system 770 includes mount 772 and safety device 720. Mount 772 includes female couplers 774 configured to receive one of upper male couplers 724 and lateral male couplers 726 to thereby couple (e.g., rigidly couple) safety device 720 to mount 772. Mount 772 includes a band, shown as elastic band 776, configured to couple mount 772 to safety headwear 190, such as by wrapping elastic band 776 around safety headwear 190 (FIG. 54). Safety device 720 can be coupled to mount 772 in a vertical orientation (FIG. 56) in which lateral male couplers 726 are coupled to female couplers 774, or a horizontal orientation (FIG. 57) in which upper male couplers 724 are coupled to female couplers 774.

In various embodiments, the detectors described herein can detect high voltage, high or low temperatures, harmful gasses, and/or additional data on nearby electrical currents.

Referring to FIGS. 58-63, safety system 810 is shown according to an exemplary embodiment. Safety system 810 is substantially the same as safety system 110, safety device 210, safety system 260, safety system 310, safety system 410, safety system 510, safety device 620, safety system 740, safety system 750, or safety system 760 except for the differences discussed herein.

Safety system 810 includes first device 820. First device 820 couples to front 194 of body 192 of safety headwear 190. First device 820 includes housing 822 and tongues 830 extending from housing 822 towards each other, the tongues 830 engaging with ribs 198 of safety headwear 190. In particular, tongues 830 of first device 820 engage within channels 199 of safety headwear 190, which are defined between ribs 198 and body 192. First device 820 slides down towards brim 196 of safety headwear 190 when tongues 830 are engaging ribs 198.

First device 820 includes a locking element 850 slidably coupled to housing 822. Locking element 850 slides between an engaged position and an unengaged position (FIG. 58) with respect to housing 822 of first device 820. In various embodiments, locking element 850 engages with a protrusion extending forward from safety headwear to lock first device 820 to safety headwear 190. When locking element 850 is in the engaged position, housing 822 is biased from sliding upward away from brim 196, and as a result first device 820 remains coupled, such as rigidly coupled, to safety headwear 190. In particular, first device 820 is coupled to safety headwear 190 via three points, i.e., both tongues 830 engaging both ribs 198, and locking element 850 engaging the protrusion extending forward from safety headwear 190. When locking element 850 is in the unengaged position, housing 822 is permitted to slide upward away from brim 196, thereby permitting first device 820 to be decoupled from safety headwear 190.

In various embodiments, safety system 810 includes first device 820, battery 860, and cord 862 that electrically couples battery 860 to first device 810. In various other embodiments, safety system 810 does not include battery 860 and cord 862, and thus only includes first device 820.

In various embodiments, first device 820 includes one or more interface buttons 828 that a user can manipulate to control, configure, and turn on and off first device 820. First device 820 includes one or more notification devices, shown as speaker 840 and LED array 842. In various embodiments, speaker 840 is oriented to emit sound forward. In use, when first device 820 detects a safety condition, such as a nearly electrical current that is sufficiently strong (e.g., high voltage and/or high amperage), one or more of the notification devices are triggered to alert the user. In various embodiments, a user can manipulate interface buttons 828 to adjust how first device 820 provides a notification of a safety condition (e.g., toggle between muting the alarms, only emitting a sound warning, only emitting a visual warning, and/or emitting both sound and visual warnings).

Figure 59:
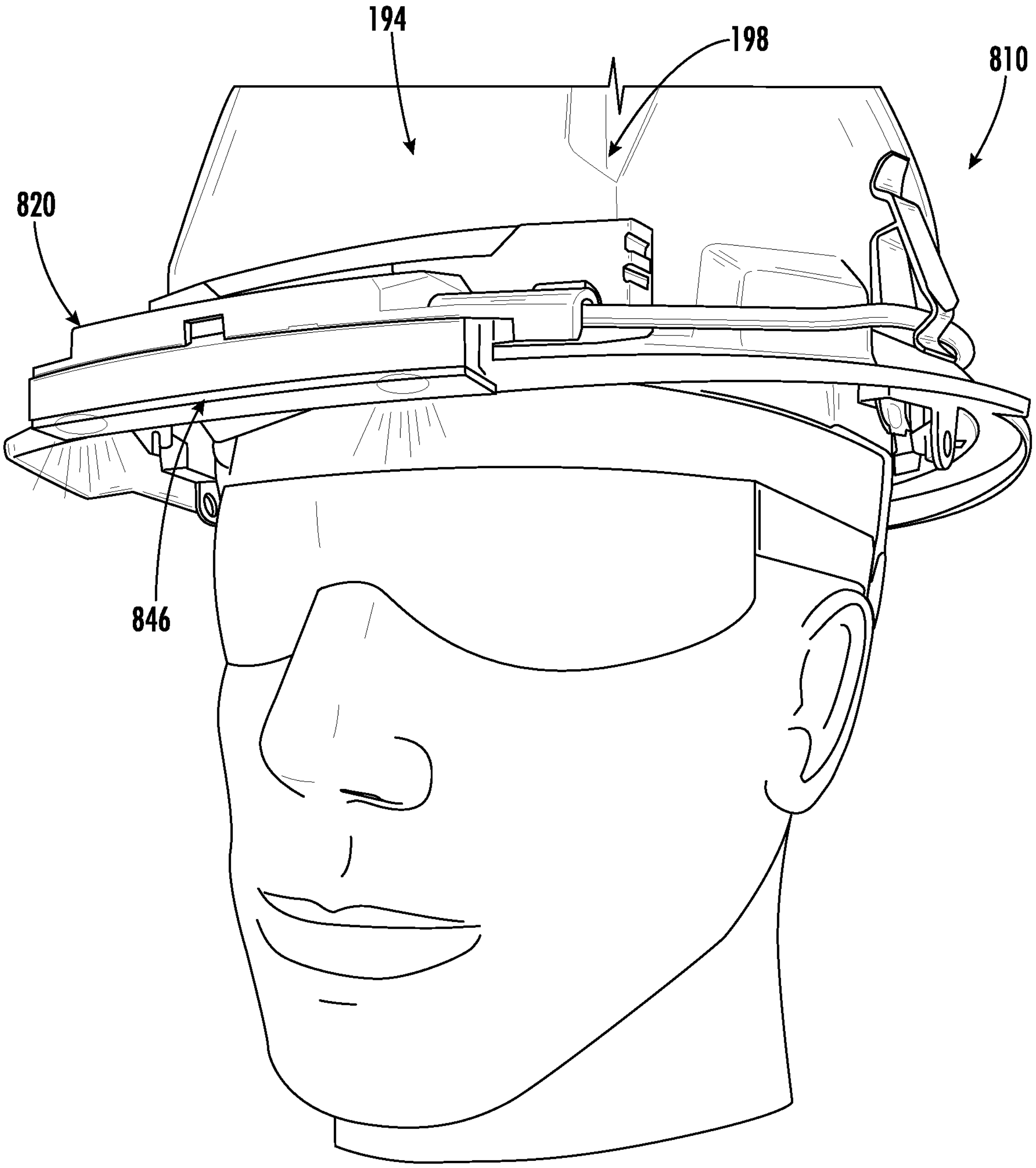
FIG. 59 is a perspective view of the safety system of FIG. 58, according to an exemplary embodiment.
Figure 60:
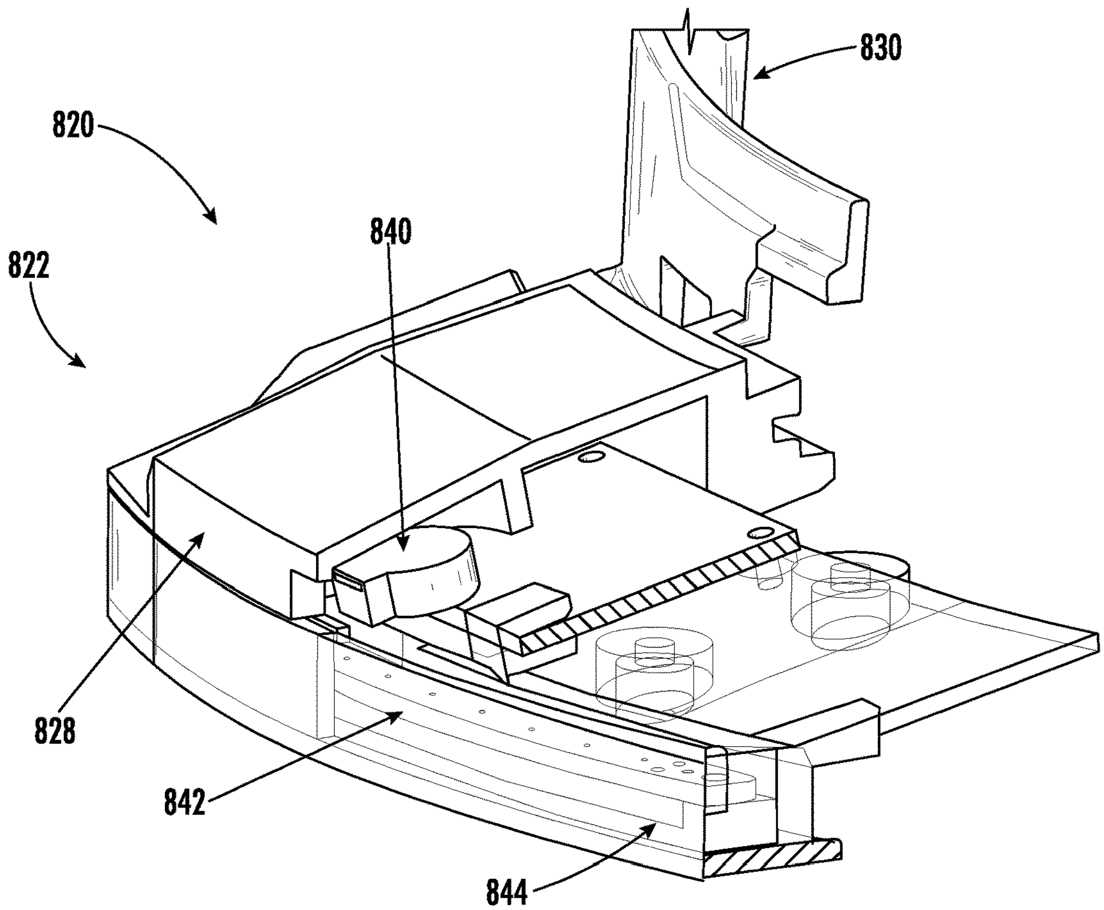
FIG. 60 is a perspective view of a portion of the safety system of FIG. 58, according to an exemplary embodiment.

Referring to FIGS. 59-60, in various embodiments, first device 820 includes LED array 842, light pipe 844, and light emission panel 846. In use, LED array 842 is turned on and emits light into light pipe 844, which laterally transmits the light (e.g., via reflection and/or refraction) along the length of light pipe 844. Light pipe 844 transmits the light into and through light emission panel 846, thereby permitting the user to see that the LED array 842 has been turned on to indicate a nearby dangerous electrical condition.

Figure 61:
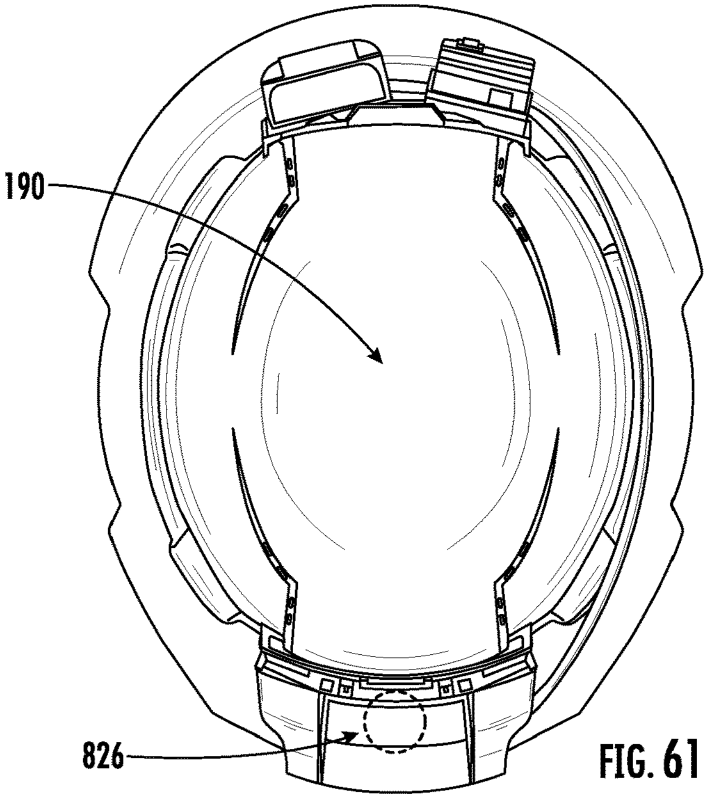
FIG. 61 is a top view of the safety system of FIG. 58, according to an exemplary embodiment.
Figure 62:
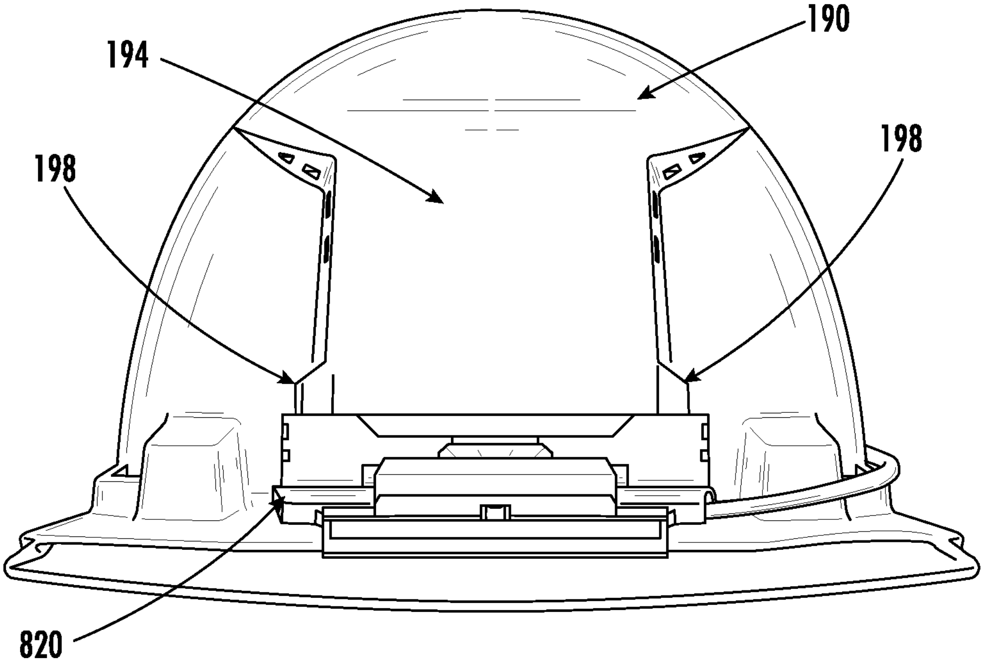
FIG. 62 is a front view of the safety system of FIG. 58, according to an exemplary embodiment.
Figure 63:
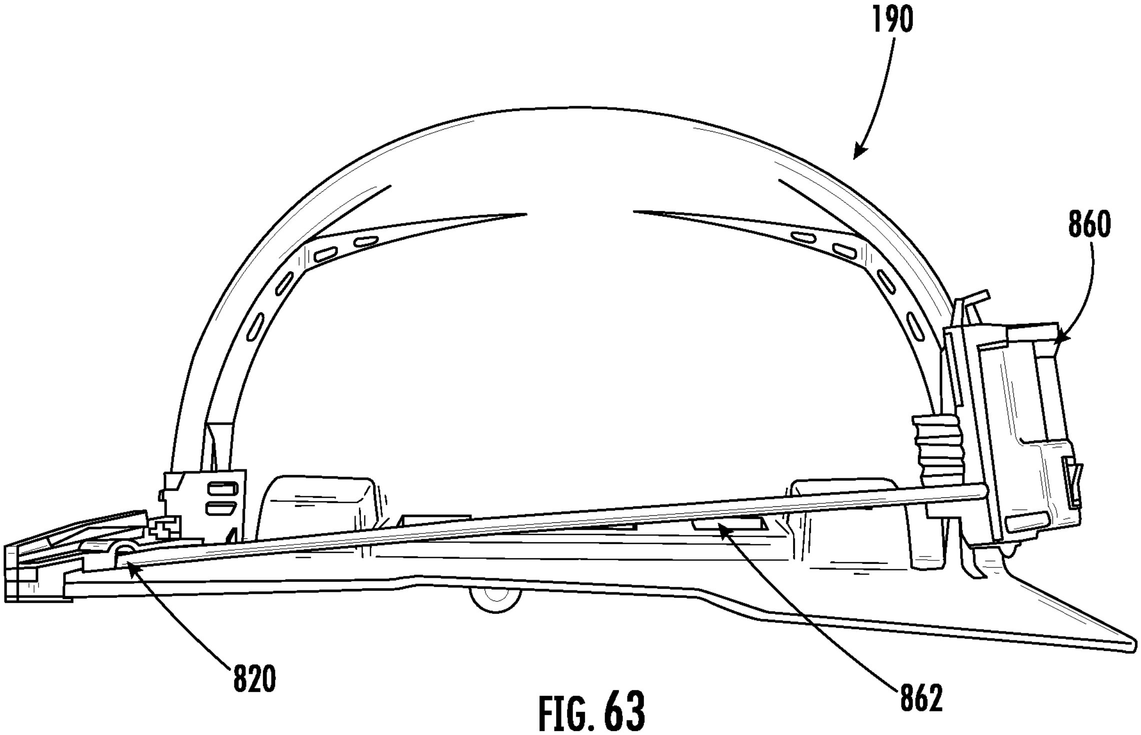
FIG. 63 is a side view of the safety system of FIG. 58, according to an exemplary embodiment.
Figure 64:
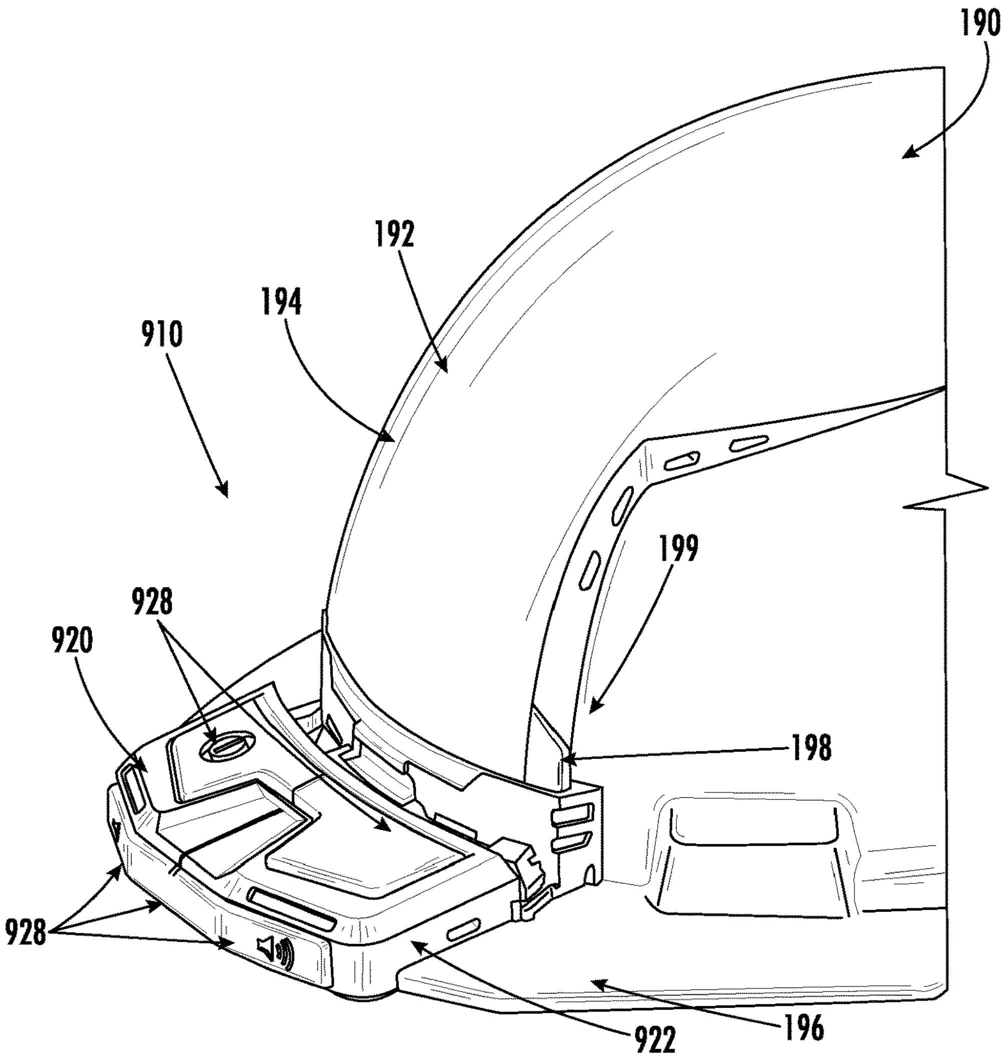
FIG. 64 is a perspective view of a safety system, according to another exemplary embodiment.

Referring to FIG. 61, first device 820 detects the safety condition of a nearby electrical current via detector 826. In use, detector 826 detects whether there is a nearby electrical current that is sufficiently strong (e.g., high voltage and/or high amperage).

Referring to FIGS. 64-72, safety system 910 is shown according to an exemplary embodiment. Safety system 910 is substantially the same as safety system 110, safety device 210, safety system 260, safety system 310, safety system 410, safety system 510, safety device 620, safety system 740, safety system 750, safety system 760 or safety system 810 except for the differences discussed herein.

Safety system 910 includes first device 920. First device 920 couples to front 194 of body 192 of safety headwear 190. First device 920 includes housing 922 and tongues 930 extending from housing 922 towards each other, the tongues 930 engaging with ribs 198 of safety headwear 190. In particular, tongues 930 of first device 920 engage within channels 199 of safety headwear 190, which are defined between ribs 198 and body 192. First device 920 slides down towards brim 196 of safety headwear 190 when tongues 930 are engaging ribs 198.

First device 920 includes a locking element 950 slidably coupled to housing 922. Locking element 950 slides between an unengaged position (FIGS. 64-65) and an engaged position (FIG. 66) with respect to housing 822 of first device 820. In various embodiments, locking element 950 engages with a protrusion 191 extending forward from safety headwear 190 to lock first device 920 to safety headwear 190.

First device 920 detects the safety condition of a nearby electrical current via detector 926. In use, detector 926 detects whether there is a nearby electrical current that is sufficiently strong (e.g., high voltage and/or high amperage).

Figure 65:
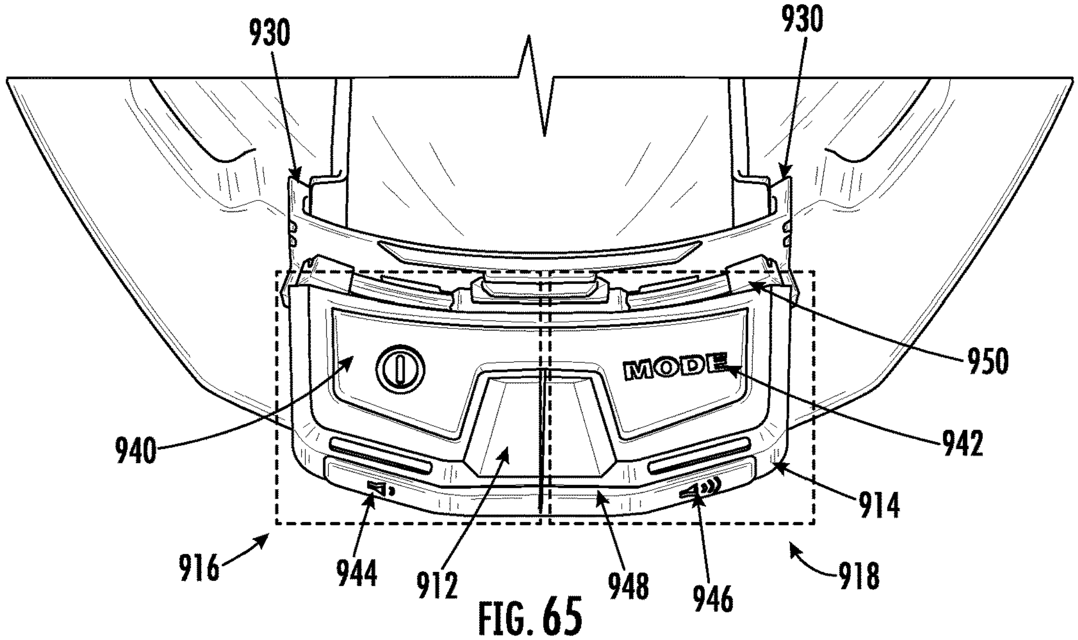
FIG. 65 is a top view of the safety system of FIG. 64, according to an exemplary embodiment.

Referring to FIG. 65, first device 920 includes one or more interface buttons 928 that a user can manipulate to control, configure, and turn on and off first device 920. In various embodiments, interface buttons 928 are very large relative to housing 922, thereby facilitating a user pressing the interface buttons 928 even when the user is wearing bulky gloves.

First device 920 includes first upper interface button 940 and second upper interface button 942 extending from upper surface 912 of housing 922. In various embodiments, first upper interface button 940 and second upper interface button 942 are on opposite halves of housing 922, and each cover the majority of their respective half of upper surface 912 of housing 922. For example, first upper interface button 940 extends across the majority of upper surface 912 on first half 916 of housing 922, and second upper interface button 942 extends across the majority of upper surface 912 of second half 918 of housing 922. In various embodiments, first front interface button 944 and second front interface button 946 are on opposite halves of housing 922, and each cover the majority of their respective half of front surface 914 of housing 922. For example, first front interface button 944 extends across the majority of front surface 914 on first half 916 of housing 922, and second front interface button 946 extends across the majority of front surface 914 of second half 918 of housing 922. In various embodiments, first device 920 includes a mute button 948 on front surface 914 of housing 922 that is configured to mute an alarm (e.g., stopping the visual and/or audio alarm being generated by first device 920).

Figure 66:
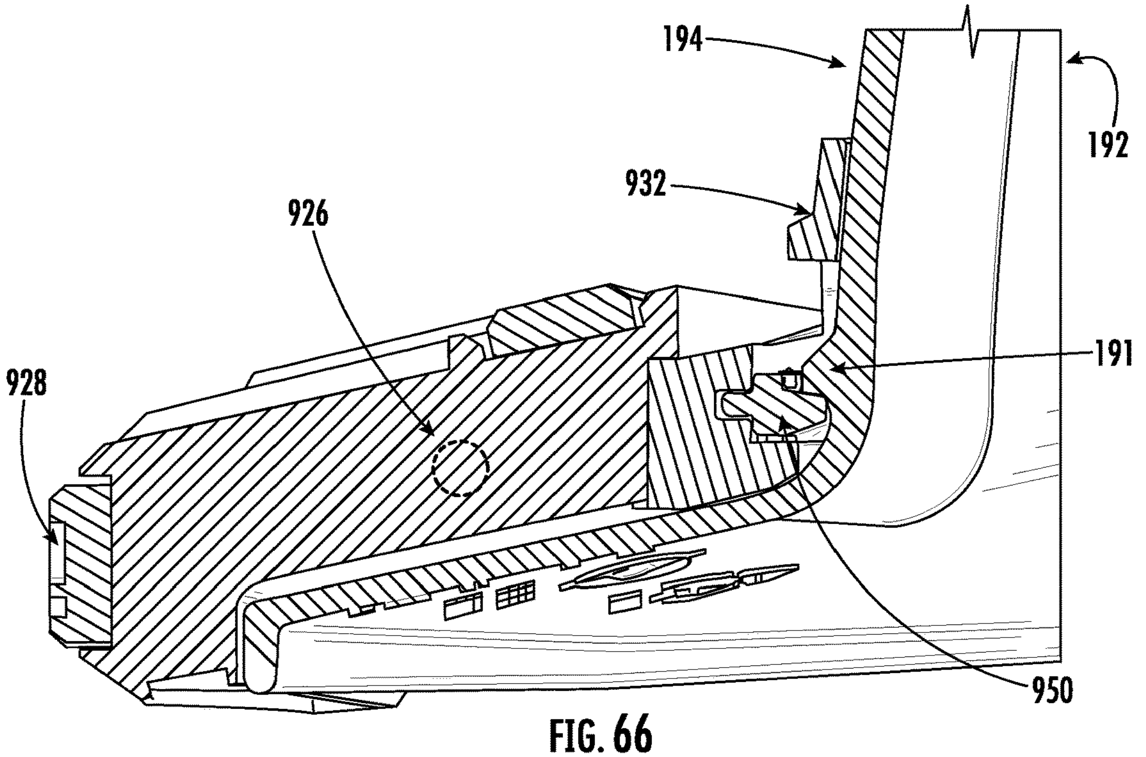
FIG. 66 is a side view of a cross-section of the safety system of FIG. 64, according to an exemplary embodiment.
Figure 67:
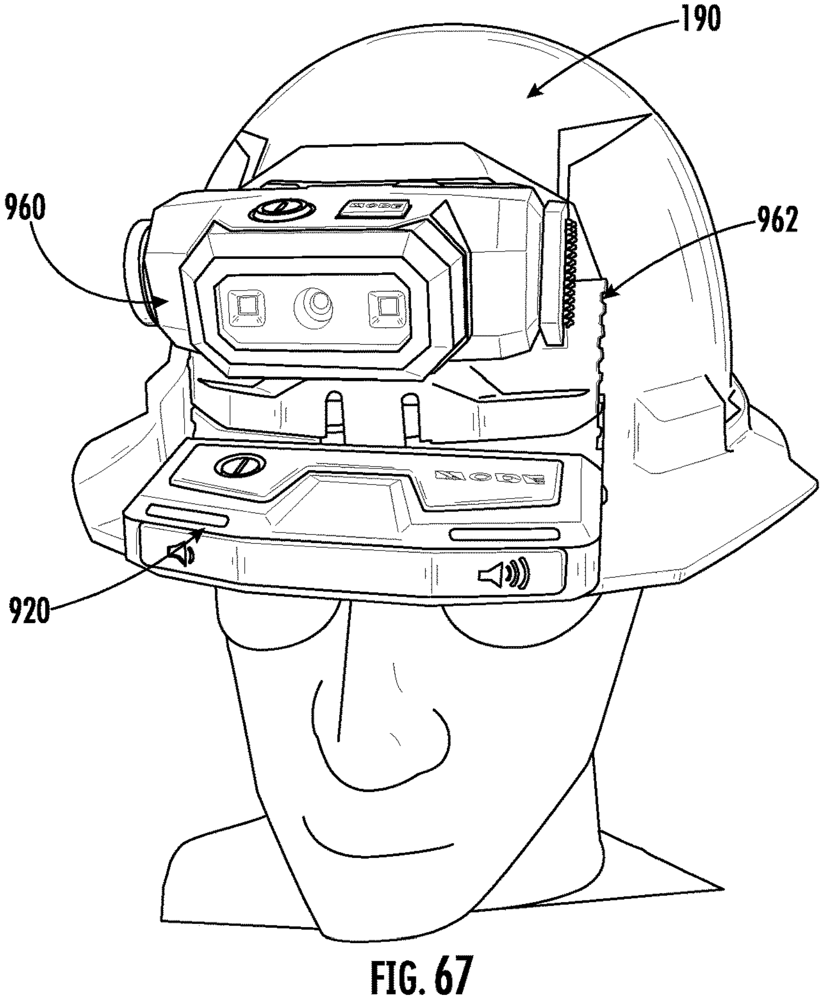
FIG. 67 is a front view of the safety system of FIG. 64 with a headlamp, according to exemplary embodiments.
Figure 68:
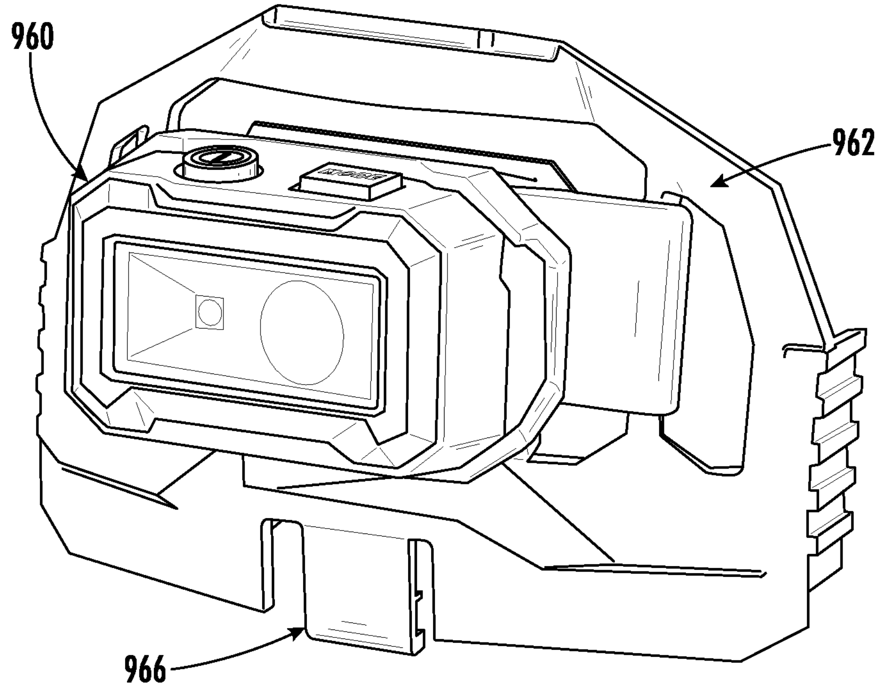
FIG. 68 is a perspective view of the headlamp of FIG. 67, according to an exemplary embodiment.

Referring to FIGS. 67-68, first device 920 may be coupled to safety headwear 190 in combination with headlamp 960 or headlamp 968. In various embodiments, headlamp 960 or headlamp 968 are coupled to base 962, which includes tongues 964 that slidably engage with ribs 198 of safety headwear 190, such that headlamp 960 or headlamp 968 are positioned above first device 920. In various embodiments, protrusion 966 extending from base 962 engages with tab 932 of first device 920 (FIG. 66). Headlamp 960 and headlamp 968 each include one or more light-emitting elements.

Figure 69:
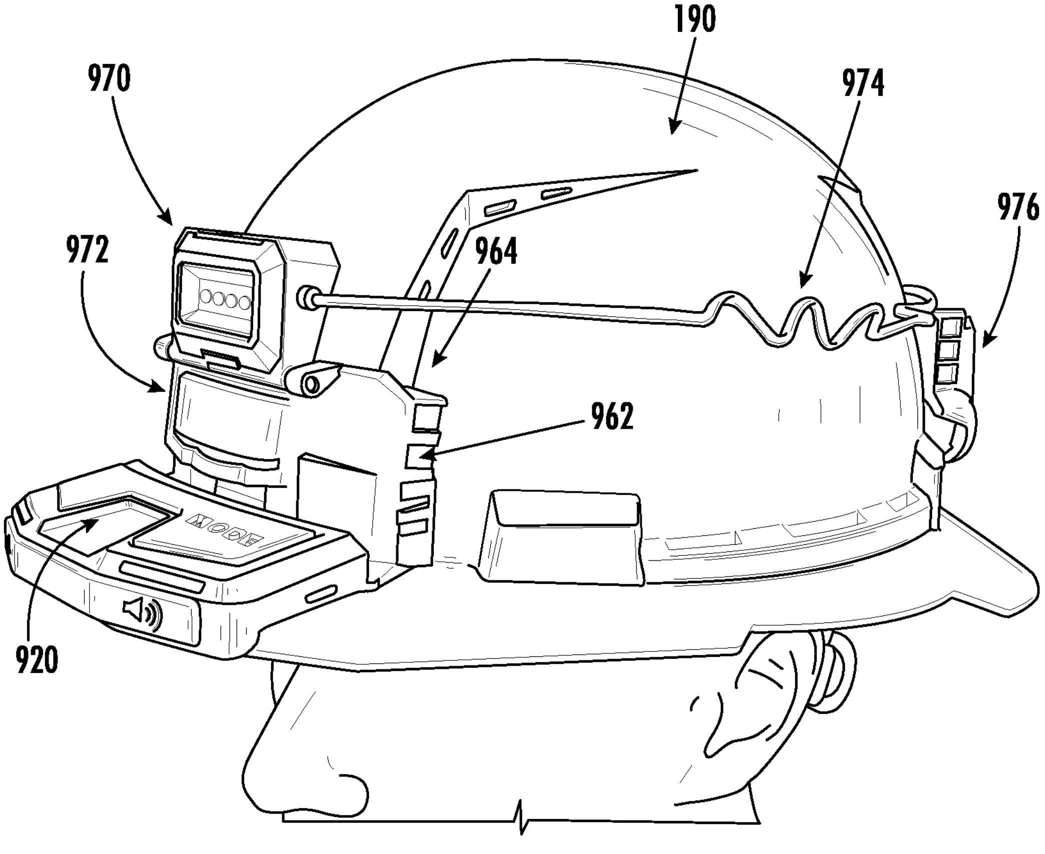
FIG. 69 is a perspective view of the safety system of FIG. 64 with another headlamp, according to exemplary embodiments.

Referring to FIG. 69, first device 920 may be coupled to safety headwear 190 in combination with headlamp 970. In various embodiments, headlamp 970 couples to base 972 that slidably engage with ribs 198 of safety headwear 190, such that headlamp 970 is positioned above first device 920. Headlamp 970 includes one or more light-emitting elements. Headlamp 970 is electrically coupled to battery 976 via cord 974. Battery is coupled 976 to safety headwear 190, such as to a rear of safety headwear 190 opposite front of safety headwear 190.

Figure 70:
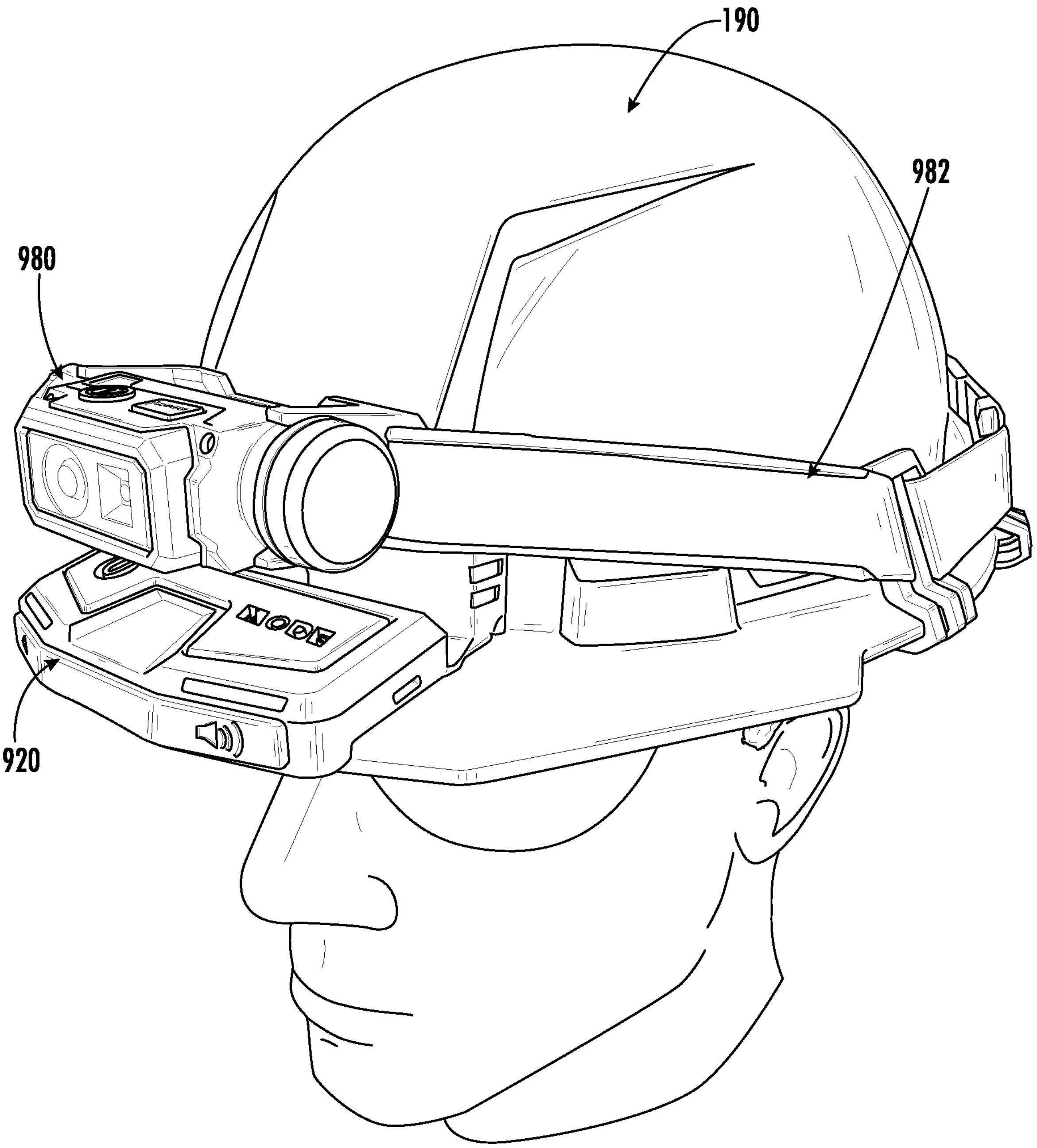
FIG. 70 is a perspective view of the safety system of FIG. 64 with the headlamp of FIG. 68, according to exemplary embodiments.

Referring to FIG. 70, first device 920 may be coupled to safety headwear 190 in combination with headlamp 980. In various embodiments, headlamp 980 is coupled to safety headwear 190 via elastic band 982, which extends around safety headwear 190. Headlamp 980 includes one or more light-emitting elements.

Figure 71:
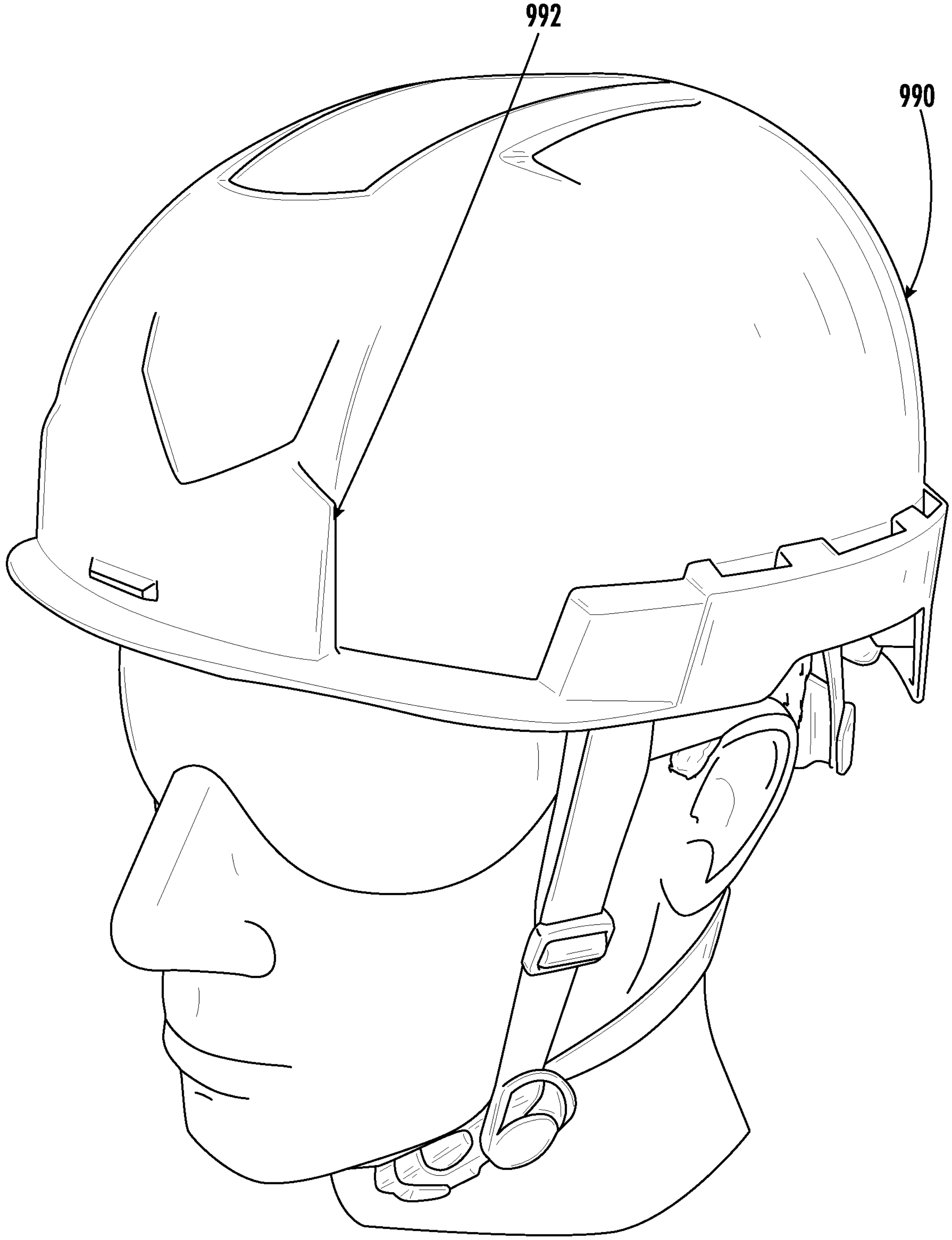
FIG. 71 is a perspective view of a safety headwear, according to an exemplary embodiment.
Figure 72:
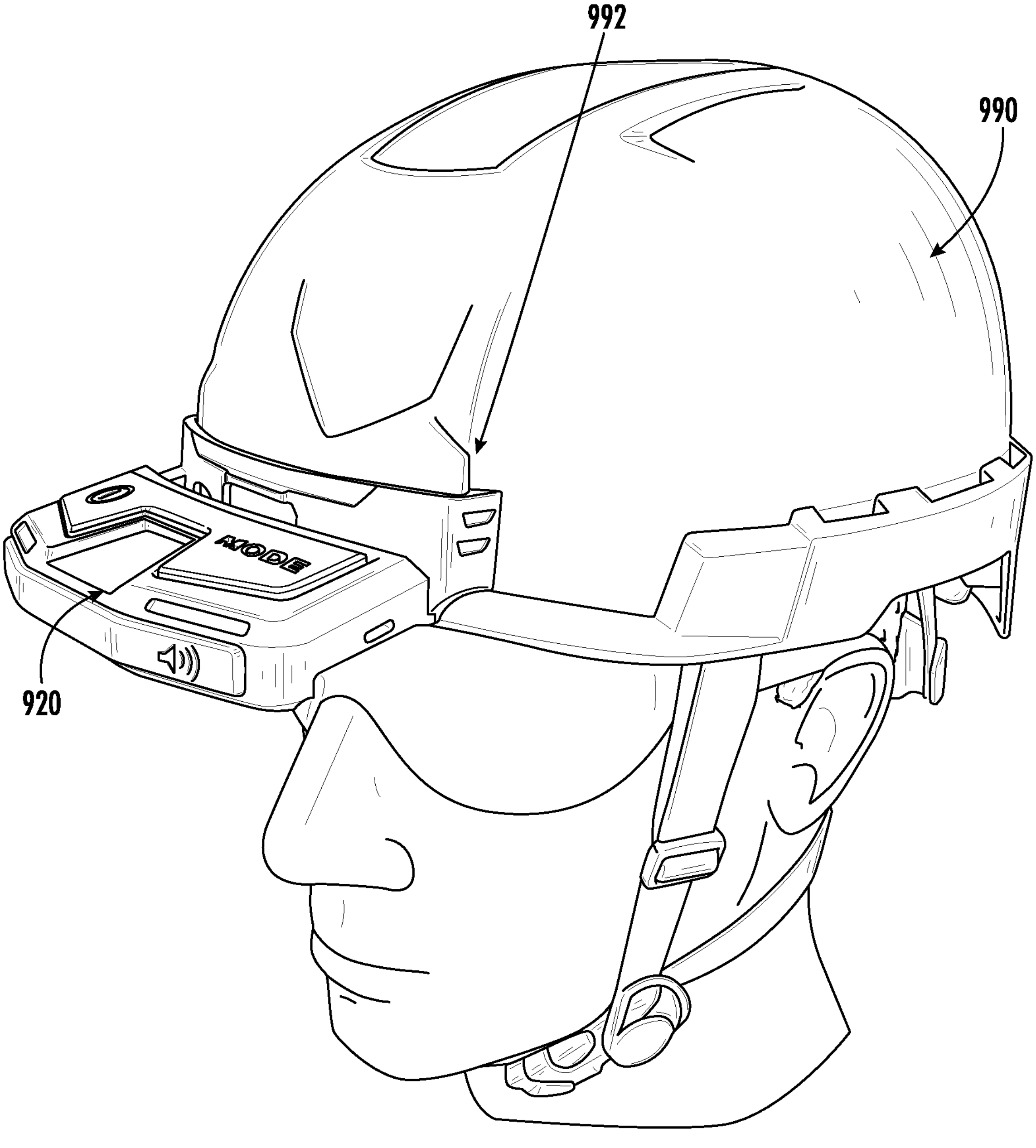
FIG. 72 is a perspective view of the safety system of FIG. 64 with the safety headwear of FIG. 71, according to exemplary embodiments.

Referring to FIGS. 71-72, first device 920 may be coupled to safety headwear 990, which does not include a brim. In particular, tongues of first device 920 are slidably engaged with ribs 992 of safety headwear 990.

It should be understood that the figures illustrate the exemplary embodiments in detail, and it should be understood that the present application is not limited to the details or methodology set forth in the description or illustrated in the figures. It should also be understood that the terminology is for description purposes only and should not be regarded as limiting.

Further modifications and alternative embodiments of various aspects of the disclosure will be apparent to those skilled in the art in view of this description. Accordingly, this description is to be construed as illustrative only. The construction and arrangements, shown in the various exemplary embodiments, are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Some elements shown as integrally formed may be constructed of multiple parts or elements, the position of elements may be reversed or otherwise varied, and the nature or number of discrete elements or positions may be altered or varied. The order or sequence of any process, logical algorithm, or method steps may be varied or re-sequenced according to alternative embodiments. Other substitutions, modifications, changes and omissions may also be made in the design, operating conditions and arrangement of the various exemplary embodiments without departing from the scope of the present disclosure.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred. In addition, as used herein, the article "a" is intended to include one or more component or element, and is not intended to be construed as meaning only one. As used herein, "rigidly coupled" refers to two components being coupled in a manner such that the components move together in a fixed positional relationship when acted upon by a force.

Various embodiments of the disclosure relate to any combination of any of the features, and any such combination of features may be claimed in this or future applications. Any of the features, elements or components of any of the exemplary embodiments discussed above may be utilized alone or in combination with any of the features, elements or components of any of the other embodiments discussed above.

For purposes of this disclosure, the term "coupled" means the joining of two components directly or indirectly to one another. Such joining may be stationary in nature or movable in nature. Such joining may be achieved with the two members and any additional intermediate members being integrally formed as a single unitary body with one another or with the two members or the two members and any additional member being attached to one another. Such joining may be permanent in nature or alternatively may be removable or releasable in nature.

While the current application recites particular combinations of features in the claims appended hereto, various embodiments of the invention relate to any combination of any of the features described herein whether or not such combination is currently claimed, and any such combination of features may be claimed in this or future applications. Any of the features, elements, or components of any of the exemplary embodiments discussed above may be used alone or in combination with any of the features, elements, or components of any of the other embodiments discussed above.

In various exemplary embodiments, the relative dimensions, including angles, lengths and radii, as shown in the Figures are to scale. Actual measurements of the Figures will disclose relative dimensions, angles and proportions of the various exemplary embodiments. Various exemplary embodiments extend to various ranges around the absolute and relative dimensions, angles and proportions that may be determined from the Figures. Various exemplary embodiments include any combination of one or more relative dimensions or angles that may be determined from the Figures. Further, actual dimensions not expressly set out in this description can be determined by using the ratios of dimensions measured in the Figures in combination with the express dimensions set out in this description.

What is claimed is:

1. A safety system comprising:

a first device comprising:

- a first housing comprising an opposing pair of protrusions extending towards each other, the protrusions configured to couple the first housing to a body of a safety headwear;
- a first detector coupled to the first housing, the first detector configured to generate a first signal in response to detecting nearby objects having currents with a high voltage; and
- a first controller coupled to the first housing and in electrical communications with the first detector, the first controller configured to emit a second signal in response to receiving the first signal from the first detector; and a second device comprising:

- a second housing configured to couple to a brim of the safety headwear;
- a second controller coupled to the second housing and in electrical communications with the first controller, the second controller configured to generate a third signal in response to receiving the second signal from the first controller;
- a notification device physically coupled to the second housing and in electrical communications with the second controller, the notification device configured to generate an alarm in response to the notification device receiving the third signal from the second controller; and
- an aperture and a protrusion extending into the aperture, the aperture and protrusion configured to collectively couple the second device to the brim of the safety headwear.

2. The safety system of claim 1, wherein the first controller and second controller wirelessly communicate with each other.

3. The safety system of claim 1, the first device comprising a plurality of interface buttons electrically coupled to the first controller and configured to control the first controller and the first detector.

4. The safety system of claim 1, wherein the alarm comprises a first alarm selected from the group consisting of a visual alarm and an audio alarm.

5. The safety system of claim 1, wherein the alarm comprises a haptic alarm.

6. The safety system of claim 1, the first housing defining a back surface facing away from the second device, the protrusions extending over the back surface.

7. The safety system of claim 1, the second housing defining a lower surface, wherein the notification device is coupled to the lower surface.

8. The safety system of claim 7, wherein the notification device generates a visual alarm in response to the notification device receiving the third signal from the second controller.

9. The safety system of claim 1, the aperture extending through the second housing.

* * * * *